United States Patent
Nishimura

(10) Patent No.: US 9,143,148 B2
(45) Date of Patent: Sep. 22, 2015

(54) AMPLIFICATION CIRCUIT, SOURCE DRIVER, ELECTROOPTICAL DEVICE, AND ELECTRONIC DEVICE

(71) Applicant: SEIKO EPSON CORPORATION, Tokyo (JP)

(72) Inventor: Motoaki Nishimura, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 15 days.

(21) Appl. No.: 14/218,545

(22) Filed: Mar. 18, 2014

(65) Prior Publication Data
US 2014/0292409 A1    Oct. 2, 2014

(30) Foreign Application Priority Data

Mar. 26, 2013  (JP) .................. 2013-063538
Mar. 27, 2013  (JP) .................. 2013-067403

(51) Int. Cl.
| | |
|---|---|
| G09G 5/10 | (2006.01) |
| H03M 1/10 | (2006.01) |
| G09G 3/36 | (2006.01) |
| H03M 1/76 | (2006.01) |

(52) U.S. Cl.
CPC ........... *H03M 1/1061* (2013.01); *G09G 3/3696* (2013.01); *G09G 2310/0291* (2013.01); *H03M 1/765* (2013.01)

(58) Field of Classification Search
None
See application file for complete search history.

(56) References Cited

U.S. PATENT DOCUMENTS

| | | |
|---|---|---|
| 5,995,073 A | 11/1999 | Isami et al. |
| 6,898,096 B2 | 5/2005 | Endo et al. |
| 7,498,833 B2 | 3/2009 | Tanaka |
| 7,786,970 B2 | 8/2010 | Gotou |
| 7,852,303 B2 | 12/2010 | Hashimoto |
| 8,310,422 B2 | 11/2012 | Nishimura |
| 2010/0026356 A1 | 2/2010 | Liao |
| 2010/0244779 A1 | 9/2010 | Hara |
| 2012/0001952 A1 | 1/2012 | Hasegawa et al. |

FOREIGN PATENT DOCUMENTS

| | | |
|---|---|---|
| JP | A-09-281930 | 10/1997 |
| JP | A-2000-242233 | 9/2000 |
| JP | A-2002-313925 | 10/2002 |
| JP | A-2006-178356 | 7/2006 |
| JP | A-2006-323341 | 11/2006 |
| JP | A-2007-288477 | 11/2007 |
| JP | A-2009-094614 | 4/2009 |
| JP | A-2009-194485 | 8/2009 |
| JP | A-2010-039463 | 2/2010 |
| JP | A-2010-134107 | 6/2010 |
| JP | A-2012-014105 | 1/2012 |

*Primary Examiner* — Kenneth B Lee, Jr.
(74) *Attorney, Agent, or Firm* — Oliff PLC

(57) ABSTRACT

An amplification circuit that can reduce an area without using transistors with a high withstand voltage. The amplification circuit (100) includes: an operational amplifier with a first input terminal connected to a reference node; a first capacitor (CA1) provided between a first node and the reference node; a second capacitor (CA2) provided between a second node and the reference node; a switch element (SW1) provided between the first node and an input node of an input voltage; a switch element (SW2) provided between the first node and a supply node of a first analog reference voltage; a switch element (SW3) provided between the second node and an output node of an output voltage; a switch element (SW4) provided between the second node and a supply node of a second analog reference voltage; and a switch element (SW5) provided between the output node of the output voltage and the reference node.

20 Claims, 25 Drawing Sheets

$Q2' = C2 \cdot (VN-VQ)$ $Q1' = C1 \cdot (VIN-VN)$

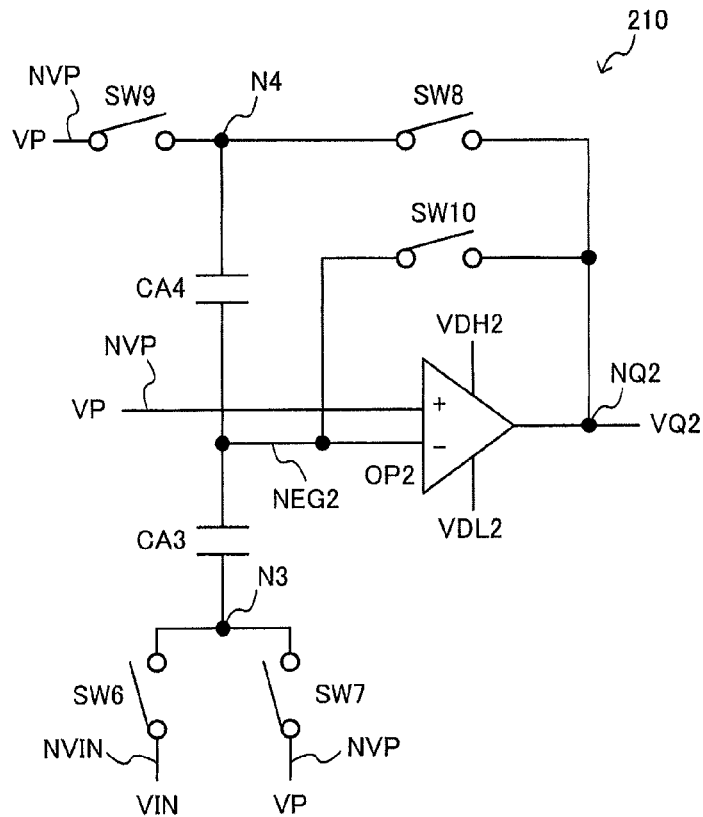
FIG. 7A
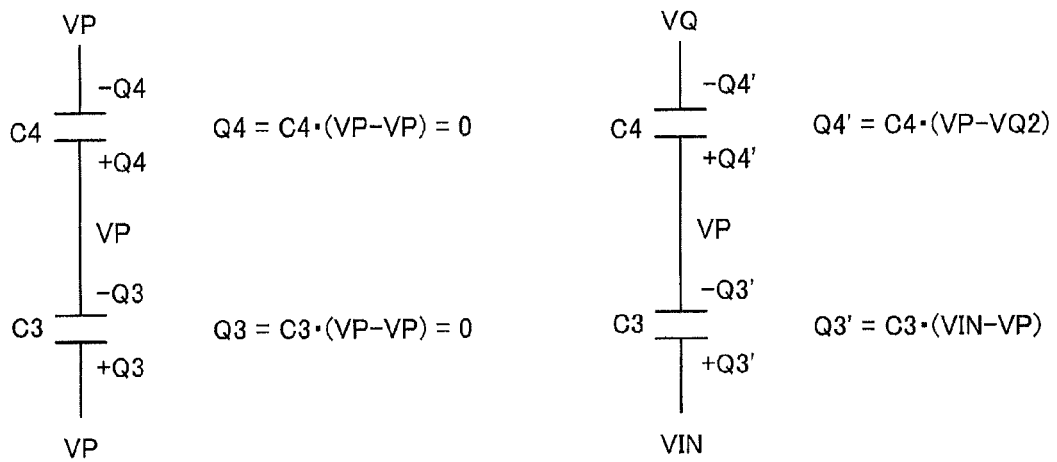
FIG. 7B
FIG. 7C

NEGATIVE POLARITY PERIOD (FIRST STATE)

POSITIVE POLARITY PERIOD (SECOND STATE)

AMPLIFICATION CIRCUIT, SOURCE DRIVER, ELECTROOPTICAL DEVICE, AND ELECTRONIC DEVICE

The present application claims a priority based on Japanese Patent Application No. 2013-063538 filed on Mar. 26, 2013 and Japanese Patent Application No. 2013-067403 filed on Mar. 27, 2013, the contents of which are incorporated herein by reference.

BACKGROUND

1. Technical Field

The present invention relates to an amplification circuit, a source driver, an electrooptical device, and an electronic device.

2. Related Art

If the same voltage (direct-current voltage) is applied to liquid crystals for a long period of time, a tilt of the liquid crystals is fixed. As a result, an image persistence phenomenon occurs, and the life of the liquid crystals is shortened. In order to prevent such issues, liquid crystal display devices need to convert a liquid crystal driving voltage applied to liquid crystals into an alternating-current voltage at a constant time interval, that is to say, change a liquid crystal driving voltage applied to pixel electrodes into a positive voltage and a negative voltage at a constant time interval using a voltage of a common electrode as a reference.

For example JP-A-9-281930, which is an example of related art, discloses a dot inversion driving method in which driving is performed while inverting the polarity of a driving voltage for each source line. In this dot inversion driving, a positive voltage and a negative voltage may be given respectively to one end and the other end of a polarity inversion switch (dot inversion switch). Therefore, the polarity inversion switch needs to use elements that are not damaged by a difference between positive and negative voltages, that is to say, elements with a high withstand voltage.

In view of the above, JP-A-2006-178356, which is another example of related art, discloses a method for reducing a voltage applied to a polarity inversion switch by providing a common short-circuit switch that supplies an intermediate potential. However, a problem with this method is that, for example, it is necessary to use elements with a high withstand voltage in a circuit that generates a signal for switching on and off the polarity inversion switch.

SUMMARY

An advantage of some aspects of the invention is that it is possible to provide an amplification circuit, a source driver, an electrooptical device, and an electronic device that can reduce an area occupied by circuits by configuring the circuits in a simplified manner without using transistors with a high withstand voltage.

A first aspect of the invention relates to an amplification circuit including: an operational amplifier with a first input terminal connected to a reference node; a first capacitor provided between a first node and the reference node; a second capacitor provided between a second node and the reference node; a first switch element provided between the first node and an input node of an input voltage; a second switch element provided between the first node and a supply node of a first analog reference voltage; a third switch element provided between the second node and an output node of an output voltage; a fourth switch element provided between the second node and a supply node of a second analog reference voltage; and a fifth switch element provided between the output node of the output voltage and the reference node. The input voltage changes in a range between a first voltage and a second voltage. The second voltage and a third voltage are supplied to the operational amplifier as a first power supply voltage and a second power supply voltage, respectively. The first analog reference voltage is a direct-current voltage in a range between the first voltage and the second voltage. The second analog reference voltage is a direct-current voltage between the second voltage and the third voltage. The first voltage, the second voltage and the third voltage are different from one another, and the second voltage is a voltage between the first voltage and the third voltage.

According to the first aspect of the invention, the amplification circuit can output a negative output voltage from input of a positive input voltage. In this way, for example, in the case where source lines of an electrooptical panel are driven through dot inversion driving and the like, the amplification circuit can output a negative gradation voltage from input of a positive gradation voltage. As a result, for example, circuit configurations can be simplified in a source driver that drives the source lines of the electrooptical panel.

In the first aspect of the invention, it is preferable that the second switch element, the fourth switch element and the fifth switch element be switched on in an initialization period, whereas the first switch element and the third switch element be switched on in an output period for outputting the output voltage.

In this way, an electric charge is accumulated in the reference node in the initialization period, and the accumulated electric charge is stored in the output period. Consequently, the amplification circuit can output a desired output voltage to the output node.

In the first aspect of the invention, it is preferable that a second input terminal of the operational amplifier be connected to a supply node of the second analog reference voltage.

In this way, an imaginary short-circuit function of the operational amplifier sets the reference node at the second analog reference voltage.

In the first aspect of the invention, it is preferable that a withstand voltage of the first capacitor be higher than a difference between the second voltage and the third voltage.

This can prevent the first capacitor from being damaged by a voltage applied thereto.

In the first aspect of the invention, it is preferable that the first capacitor be a metal-insulator-metal capacitor.

In this way, a withstand voltage of the first capacitor can be higher than a difference between the second voltage and the third voltage.

In the first aspect of the invention, it is preferable that the output voltage be given by $VQ=VN-(C1/C2)\times(VIN-VP)$, where a capacitance of the first capacitor is $C1$, a capacitance of the second capacitor is $C2$, the input voltage is $VIN$, the first analog reference voltage is $VP$, the second analog reference voltage is $VN$, and the output voltage is $VQ$.

In this way, the amplification circuit can output a desired output voltage with respect to the input voltage by setting the capacitances of the first and second capacitors and the first and second analog reference voltages to appropriate values.

In the first aspect of the invention, it is preferable that a withstand voltage of transistors constituting the first to the fifth switch elements and the operational amplifier be lower than a difference between the first voltage and the third voltage and be higher than a difference between the second voltage and the third voltage.

In this way, the amplification circuit can be constituted using transistors with an intermediate withstand voltage, for example, a withstand voltage of approximately 6 V, and hence achieve a high driving ability despite occupying a small area.

A second aspect of the invention relates to a source driver that drives source lines of an electrooptical panel and includes the amplification circuit according to any of the above details.

In a second aspect of the invention, it is preferable that the source driver further include a second amplification circuit, and that the first voltage and the second voltage be supplied to the second amplification circuit as the first power supply voltage and the second power supply voltage, respectively.

In this way, for example, in the case where the electrooptical panel is driven through dot inversion driving, the second amplification circuit can output a positive driving voltage in a positive polarity period, and the amplification circuit can output a negative driving voltage in a negative polarity period.

In the second aspect of the invention, it is preferable that the source driver further include: a D/A conversion circuit that receives gradation data and a plurality of reference voltages, selects one of the plurality of reference voltages that corresponds to the gradation data, and outputs the selected reference voltage to the amplification circuit and to the second amplification circuit; and a reference voltage generation circuit that generates the plurality of reference voltages and outputs the plurality of reference voltages to the D/A conversion circuit. It is also preferable that the amplification circuit output a negative driving voltage to the source lines in a first period for outputting the negative driving voltage to the source lines, and the second amplification circuit output a positive driving voltage to the source lines in a second period for outputting the positive driving voltage to the source lines.

In this way, a D/A conversion circuit and a reference voltage generation circuit for generating negative gradation voltages are unnecessary. Therefore, for example, circuit configurations can be simplified and an area occupied by circuits can be reduced.

In the second aspect of the invention, it is preferable that the second amplification circuit include: a second operational amplifier with a first input terminal connected to a second reference node; a third capacitor provided between a third node and the second reference node; a fourth capacitor provided between a fourth node and the second reference node; a sixth switch element provided between the third node and an input node of the input voltage; a seventh switch element provided between the third node and a supply node of the first analog reference voltage; an eighth switch element provided between the fourth node and an output node of a second output voltage; a ninth switch element provided between the fourth node and a supply node of the first analog reference voltage; and a tenth switch element provided between the output node of the second output voltage and the second reference node. It is also preferable that the input voltage change in a range between the first voltage and the second voltage, and the first voltage and the second voltage be supplied to the second operational amplifier as power supply voltages.

In this way, the second amplification circuit can output a desired second output voltage with respect to the input voltage by setting the capacitances of the third and fourth capacitors and the first analog reference voltage to appropriate values.

A third aspect of the invention relates to a circuit device including: a voltage generation circuit that generates and outputs a first supply voltage and a second supply voltage, the first supply voltage changing in a range between the first voltage and the second voltage that is higher than the first voltage, and the second supply voltage changing in a range between the second voltage and the third voltage that is higher than the second voltage; and a signal generation circuit including an inverter to which the first supply voltage and the second supply voltage are supplied as a low-potential power supply and a high-potential power supply, respectively, the second voltage being input to a gate of the inverter. The voltage generation circuit is placed in a first state or a second state based on a state switching signal, outputs a voltage level of the first voltage as the first supply voltage and outputs a voltage level of the second voltage as the second supply voltage in the first state, and outputs the voltage level of the second voltage as the first supply voltage and outputs a voltage level of the third voltage as the second supply voltage in the second state. The signal generation circuit outputs a signal at the voltage level of the first voltage when the voltage generation circuit is in the first state, and outputs a signal at the voltage level of the third voltage when the voltage generation circuit is in the second state.

The third aspect of the invention makes it possible to switch the voltage levels of the first supply voltage and the second supply voltage based on the state switching signal. Furthermore, the output voltage of the signal generation circuit can be switched based on the state switching signal.

In the third aspect of the invention, it is preferable that a withstand voltage of transistors constituting the inverter be lower than a difference between the first voltage and the third voltage.

In this way, the signal generation circuit can be configured without using transistors with a high withstand voltage, for example, a withstand voltage higher than the difference between the first voltage and the third voltage.

In the third aspect of the invention, it is preferable that the voltage generation circuit include a first inverter and a second inverter. Here, the first voltage and the second voltage are supplied to the first inverter as a low-potential power supply and a high-potential power supply, respectively, and the first inverter outputs the first supply voltage. The second voltage and the third voltage are supplied to the second inverter as a low-potential power supply and a high-potential power supply, respectively, and the second inverter outputs the second supply voltage. It is also preferable that, in the first state, a signal at the voltage level of the second voltage be input to the first inverter, and a signal at the voltage level of the third voltage be input to the second inverter. It is also preferable that, in the second state, a signal at the voltage level of the first voltage be input to the first inverter, and a signal at the voltage level of the second voltage be input to the second inverter.

In this way, in the first state, the first inverter can output the voltage level of the first voltage, and the second inverter can output the voltage level of the second voltage. Furthermore, in the second state, the first inverter can output the voltage level of the second voltage, and the second inverter can output the voltage level of the third voltage.

In the third aspect of the invention, it is preferable that a withstand voltage of transistors constituting the first and second inverters be lower than a difference between the first voltage and the third voltage.

In this way, the voltage generation circuit can be configured without using transistors with a high withstand voltage, for example, a withstand voltage higher than the difference between the first voltage and the third voltage.

In the third aspect of the invention, it is preferable that the signal generation circuit be a switch control signal generation circuit that outputs a switch control signal for controlling on and off of switch elements. It is also preferable that the voltage generation circuit be a well potential generation circuit that outputs the first supply voltage to a P-type well of the transistors constituting the switch elements, and outputs the second supply voltage to an N-type well of the transistors constituting the switch elements. It is also preferable that the voltage generation circuit switch the potentials of the P-type well and the N-type well by switching from the first state to the second state, and from the second state to the first state, based on the state switching signal.

This can prevent application of a voltage equal to the difference between the first voltage and the third voltage to the transistors constituting the switch elements. Therefore, the switch elements can be constituted without using transistors with a high withstand voltage, for example, a withstand voltage higher than the difference between the first voltage and the third voltage.

In the third aspect of the invention, it is preferable that, when the voltage generation circuit switches from the first state to the second state and from the second state to the first state, the voltage generation circuit output a first intermediate voltage as the first supply voltage and a second intermediate voltage as the second supply voltage. Here, the first intermediate voltage is an intermediate voltage between the first voltage and the second voltage, and the second intermediate voltage is an intermediate voltage between the second voltage and the third voltage.

In this way, the voltage generation circuit can gradually change the first supply voltage and the second supply voltage, and hence prevent application of a voltage that exceeds the withstand voltage of the transistors due to incoincidence of the timings for switching the potentials of the P-type well and the N-type well.

A fourth aspect of the invention relates to a source driver that drives source lines of an electrooptical panel and includes the circuit device according to any of the above details.

According to the fourth aspect of the invention, the source driver can be configured without using transistors with a high withstand voltage, for example, a withstand voltage higher than the difference between the first voltage and the third voltage.

In the fourth aspect of the invention, it is preferable that the source driver further include a driving signal output terminal that outputs a driving signal for driving the source lines and a drive circuit that outputs the driving signal to the driving signal output terminal. Here, the drive circuit includes a first switch element, a second switch element, a first amplification circuit, and a second amplification circuit. One end of the first switch element and one end of the second switch element are mutually connected to the driving signal output terminal. The first switch element and the second switch element are switched on and off based on a switch control signal output from the signal generation circuit. The first amplification circuit outputs the driving signal of negative polarity to the other end of the first switch element. The second amplification circuit outputs the driving signal of positive polarity to the other end of the second switch element. It is also preferable that, in a first period for outputting the driving signal of negative polarity to the source lines, the voltage generation circuit be placed in the first state and the first switch element be switched on, whereas in a second period for outputting the driving signal of positive polarity to the source lines, the voltage generation circuit be placed in the second state and the second switch element be switched on. It is also preferable that the voltage generation circuit output the first supply voltage to a P-type well of transistors constituting the first switch element and the second switch element, and output the second supply voltage to an N-type well of such transistors.

In this way, the potentials of the P-type well and the N-type well of the transistors constituting the first and second switch elements can be switched in accordance with the first period and the second period.

In the fourth aspect, it is preferable that the first switch element include a first P-type transistor and a first N-type transistor, and the second switch element include a second P-type transistor and a second N-type transistor. Here, when the voltage generation circuit is in the first state, the potentials of N-type wells of the first P-type transistor and the second P-type transistor are set at the voltage level of the second voltage, and the potentials of P-type wells of the first N-type transistor and the second N-type transistors are set at the voltage level of the first voltage. On the other hand, when the voltage generation circuit is in the second state, the potentials of the N-type wells of the first P-type transistor and the second P-type transistor are set at the voltage level of the third voltage, and the potentials of the P-type wells of the first N-type transistor and the second N-type transistor are set at the voltage level of the second voltage.

This can prevent application of a voltage equal to the difference between the first voltage and the third voltage to the transistors constituting the first and second switch elements. Therefore, the first and second switch elements can be constituted without using transistors with a high withstand voltage, for example, a withstand voltage higher than the difference between the first voltage and the third voltage.

In the fourth aspect of the invention, it is preferable that the transistors constituting the first switch element, the second switch element and the signal generation circuit share a mutual P-type well and a mutual N-type well.

In this way, the first switch element, the second switch element and the signal generation circuit share a mutual P-type well and a mutual N-type well, and therefore an efficient layout can be achieved.

In the fourth aspect of the invention, it is preferable that the source driver further include a first drive circuit block to an $n^{th}$ drive circuit block that are each provided with two or more of the drive circuit, the voltage generation circuit, and the signal generation circuit (n is an integer equal to or greater than two).

In this way, the P-type well and the N-type well are divided into a plurality of blocks such that a well potential can be set for each block. Consequently, for example, the occurrence of a latchup can be suppressed.

In the fourth aspect of the invention, it is preferable that, when the voltage generation circuits of the first to the $n^{th}$ drive circuit blocks switch from the first state to the second state or from the second state to the first state, provided that a $(j+1)^{th}$ drive circuit block and a $j^{th}$ drive circuit block are included among the first to the $n^{th}$ drive circuit blocks, switching of the voltage generation circuit of the $(j+1)^{th}$ drive circuit block be delayed from switching of the voltage generation circuit of the $j^{th}$ drive circuit block by a predetermined period (j is an integer satisfying the relationship $1 \leq j \leq n-1$).

In this way, a time difference can be set between the timings for switching the well potentials of the blocks. Consequently, for example, the occurrence of a latchup can be suppressed.

A fifth aspect of the invention relates to an electrooptical device including the above-referenced source driver.

A sixth aspect of the invention relates to an electronic device including the above-referenced electrooptical device.

BRIEF DESCRIPTION OF THE DRAWINGS

The invention will be described with reference to the accompanying drawings, wherein like numbers reference like elements.

FIG. 7A shows an example of a configuration of a positive voltage amplification circuit. FIG. 7B is a diagram for describing the operations of the positive voltage amplification circuit in an initialization period. FIG. 7C is a diagram for describing the operations of the positive voltage amplification circuit in an output period.

DESCRIPTION OF EXEMPLARY EMBODIMENTS

The following describes a preferred embodiment of the invention in detail. It should be noted that the present embodiment described below is not intended to unreasonably limit the contents of the invention described in the attached claims, and not all configurations described in the present embodiment are indispensable as solutions provided by the invention.

1. Amplification Circuit

Figure 1:
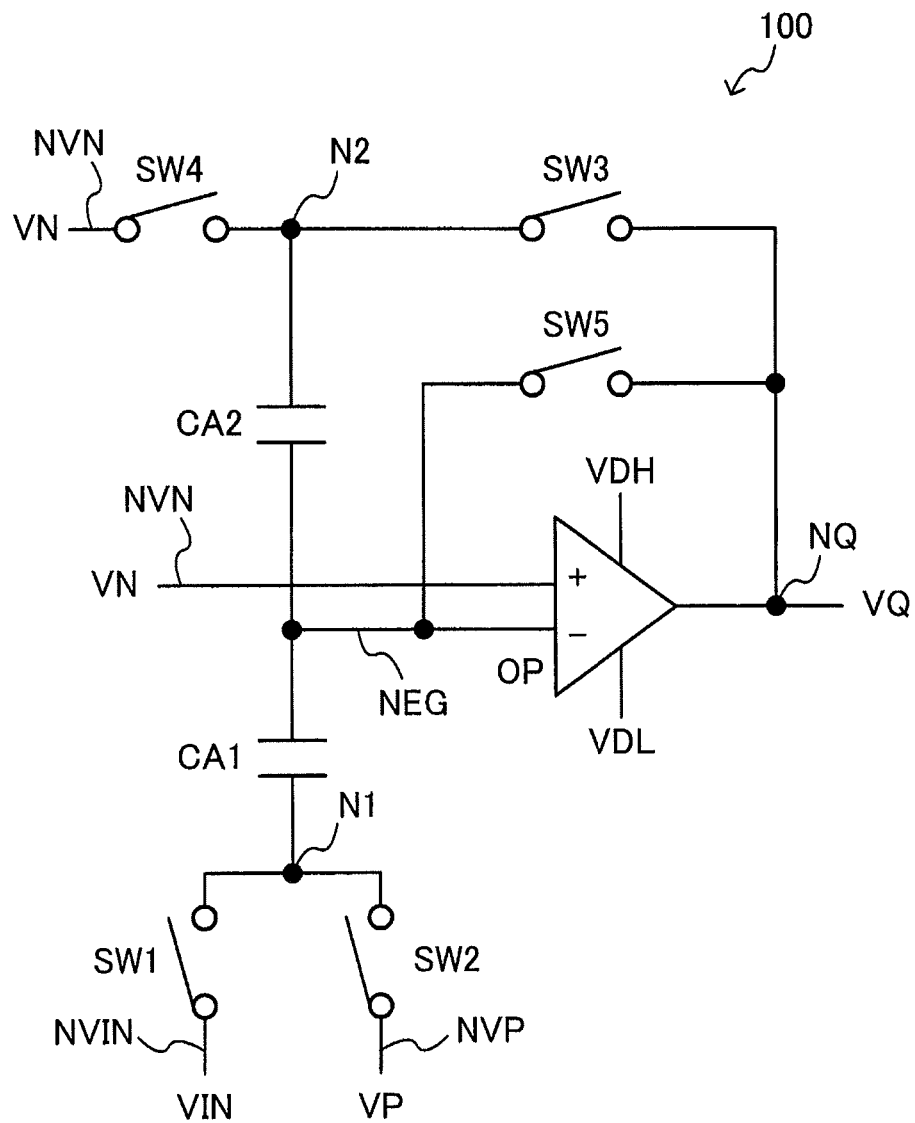
FIG. 1 shows an example of a configuration of an amplification circuit.

FIG. 1 shows an example of a configuration of an amplification circuit 100 according to the present embodiment. The amplification circuit 100 according to the present embodiment includes an operational amplifier OP, first and second capacitors CA1, CA2, and first to fifth switch elements SW1 to SW5. It should be noted that the amplification circuit 100 according to the present embodiment is not limited to the configuration of FIG. 1, and may be embodied with various modifications. For example, a part of constituent elements thereof may be omitted or replaced with other constituent elements, and other constituent elements may be added.

For example, in a source driver that drives source lines of an electrooptical panel (for example, a liquid crystal panel) adopting dot inversion driving, the amplification circuit 100 according to the present embodiment can be used as an amplification circuit that amplifies a negative driving signal and outputs the same to the source lines, as will be described later.

A reference node NEG is connected to an inverting input terminal (−) of the operational amplifier OP (broadly speaking, a first input terminal). A supply node NVN of a second analog reference voltage VN is connected to a non-inverting input terminal (+) of the operational amplifier OP (broadly speaking, a second input terminal). Furthermore, a high-potential power supply voltage VDH (broadly speaking, a first power supply voltage) and a low-potential power supply voltage VDL (broadly speaking, a second power supply voltage) are supplied to the operational amplifier OP. An output terminal of the operational amplifier OP is connected to an output node NQ of an output voltage VQ.

The first capacitor CA1 is provided between a first node N1 and the reference node NEG. The first capacitor CA1 is constituted by, for example, a metal-insulator-metal capacitor, and a withstand voltage thereof is higher than a difference between a second voltage V2 and a third voltage V3, which will be described later. For example, in the case where the second voltage V2 is 0 V and the third voltage V3 is −5 V, the withstand voltage of the first capacitor CA1 is higher than 5 V.

In a metal-insulator-metal capacitor (MIM capacitor), a first electrode is formed by a first metal layer (for example, an aluminum layer), a second electrode is formed by a second metal layer, and an insulator between the first and second electrodes is formed by an interlayer insulation layer between the first and second metal layers.

The second capacitor CA2 is provided between a second node N2 and the reference node NEG. The second capacitor CA2 may be configured similarly to the first capacitor CA1. That is to say, the second capacitor CA2 may be configured as a metal-insulator-metal capacitor.

The first switch element SW1 is provided between the first node N1 and an input node NVIN of an input voltage VIN. The second switch element SW2 is provided between the first node N1 and a supply node NVP of a first analog reference voltage VP.

The third switch element SW3 is provided between the second node N2 and the output node NQ of the output voltage VQ. The fourth switch element SW4 is provided between the second node N2 and the supply node NVN of the second analog reference voltage VN. The fifth switch element SW5 is provided between the output node NQ of the output voltage VQ and the reference node NEG.

These switch elements SW1 to SW5 can be constituted using, for example, CMOS transistors. More specifically, they can be constituted using transfer gates composed of P-type and N-type transistors. These transistors are switched on and off by a switch control signal from a switch control signal generation circuit, which is not shown in the drawings.

The input voltage VIN changes in a range between the first voltage V1 and the second voltage V2. The first analog reference voltage VP is a direct-current voltage between the first voltage V1 and the second voltage V2. The second analog reference voltage VN is a direct-current voltage between the second voltage V2 and the third voltage V3. The high-potential power supply voltage VDH of the operational amplifier OP is one of the second voltage V2 and the third voltage V3 having a higher potential. The low-potential power supply voltage VDL of the operational amplifier OP is one of the second voltage V2 and the third voltage V3 having a lower potential.

Note that the first voltage V1, the second voltage V2 and the third voltage V3 are different from one another, and the second voltage V2 is between the first voltage V1 and the third voltage V3. For example, the first voltage V1, the second voltage V2 and the third voltage V3 can be set at 5 V, 0 V and −5 V, respectively. In this case, the input voltage VIN changes in a range between 5 V (the first voltage) and 0 V (the second voltage), and the first analog reference voltage VP is a direct-current voltage between 5V (the first voltage) and 0 V (the second voltage). Also, the second analog reference voltage VN is a direct-current voltage between 0 V (the second voltage) and −5V (the third voltage). The high-potential power supply voltage VDH of the operational amplifier OP is 0 V (the second voltage), and the low-potential power supply voltage VDL of the operational amplifier OP is −5 V (the third voltage).

Figure 2A:
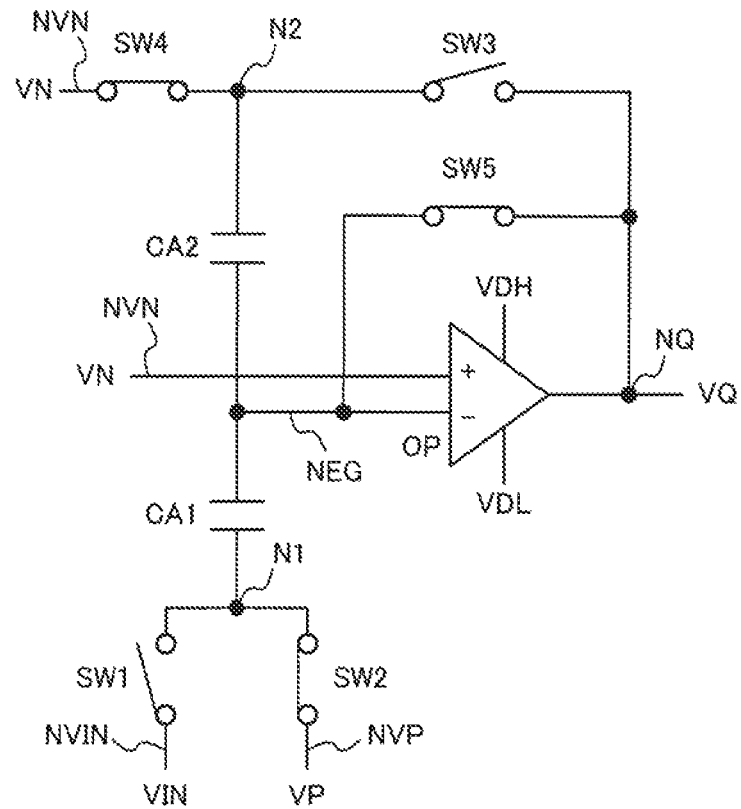
FIGS. 2A and 2B are diagrams for describing the operations of the amplification circuit in an initialization period.
Figure 2B:
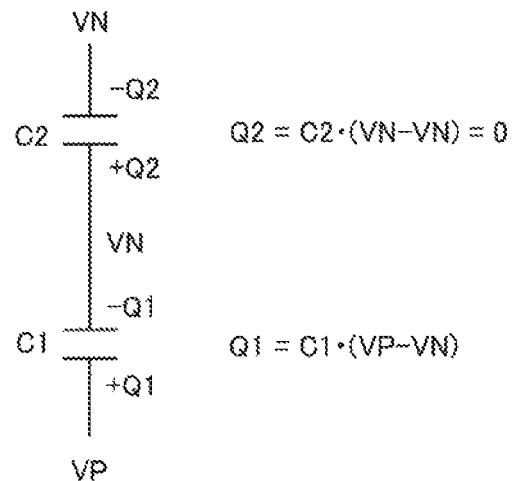

FIGS. 2A and 2B are diagrams for describing the operations of the amplification circuit 100 according to the present embodiment in an initialization period. As shown in FIG. 2A, in the initialization period, the second, fourth and fifth switch elements SW2, SW4, SW5 are switched on, while other switch elements SW1, SW3 are switched off.

Due to the on state of the switch element SW2 in the initialization period, the first capacitor CA1, which is electrically connected to the reference node NEG at one end, is set at the first analog reference voltage VP at the other end. Likewise, due to the on state of the switch element SW4, the second capacitor CA2, which is electrically connected to the reference node NEG at one end, is set at the second analog reference voltage VN at the other end. Furthermore, due to the on state of the switch element SW5, which is a feedback switch element, the output from the operational amplifier OP loops back to the inverting input terminal, and an imaginary short-circuit function of the operational amplifier OP sets the reference node NEG at the second analog reference voltage VN.

As shown in FIG. 2B, provided that a capacitance value of the first capacitor CA1 is C1 and a capacitance value of the second capacitor CA2 is C2, an electric charge Q1 accumulated in the capacitor CA1 in the initialization period is given by the following equation.

$$Q1 = C1 \cdot (VP - VN) \quad \text{Equation 1}$$

An electric charge Q2 accumulated in the capacitor CA2 is given by the following equation.

$$Q2 = C2 \cdot (VN - VN) = 0 \quad \text{Equation 2}$$

Figure 3A:
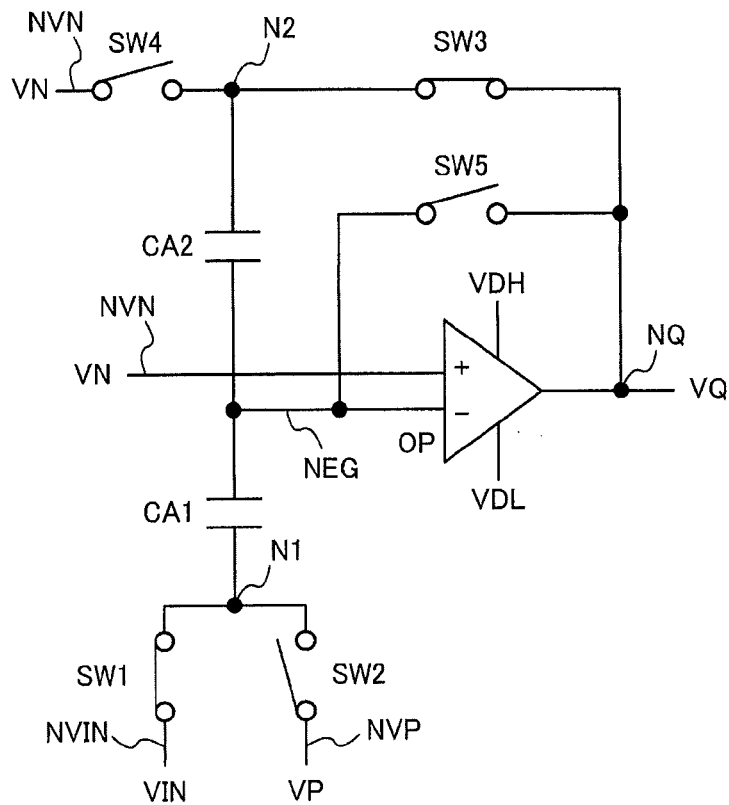
FIGS. 3A and 3B are diagrams for describing the operations of the amplification circuit in an output period.
Figure 3B:
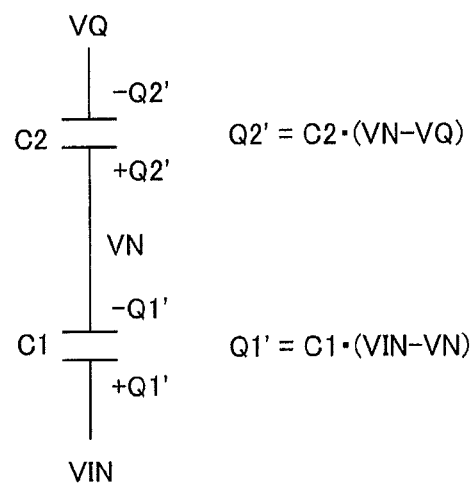

FIGS. 3A and 3B are diagrams for describing the operations of the amplification circuit 100 according to the present embodiment in an output period. As shown in FIG. 3A, in the output period, the first and third switch elements SW1, SW3 are switched on, while other switch elements SW2, SW4, SW5 are switched off.

In the output period, due to the on state of the switch element SW1, the first capacitor CA1, which is connected to the reference node NEG at one end, is set at the input voltage VIN at the other end. Likewise, due to the on state of the switch element SW3, the second capacitor CA2, which is connected to the reference node NEG at one end, is set at the output voltage VQ (the output from OP) at the other end.

As shown in FIG. 3B, an electric charge Q1' accumulated in the capacitor CA1 in the output period is given by the following equation.

$$Q1' = C1 \cdot (VIN - VN) \quad \text{Equation 3}$$

An electric charge Q2' accumulated in the capacitor CA2 is given by the following equation.

$$Q2' = C2 \cdot (VN - VQ) \quad \text{Equation 4}$$

As the reference node NEG is placed in a high impedance state in the output period, an electric charge accumulated in the reference node NEG is stored. That is to say, the electric charge accumulated in the reference node NEG is the same in the initialization period and the output period.

Therefore, based on the principle of charge conservation, the following equation holds.

$$-Q1 + Q2 = -Q1' + Q2' \quad \text{Equation 5}$$

The following equation is obtained by substituting Equations 1 to 4 into Equation 5.

$$-C1 \cdot (VP - VN) = -C1 \cdot (VIN - VN) + C2 \cdot (VN - VQ) \quad \text{Equation 6}$$

Based on Equation 6, the output voltage VQ is given by the following equation.

$$VQ = VN - (C1/C2) \cdot (VIN - VP) \quad \text{Equation 7}$$

In the case where C1=C2, the following equation holds.

$$VQ = VN - VIN + VP \quad \text{Equation 8}$$

For example, in the case where the first analog reference voltage VP=2.5 V, the second analog reference voltage VN=−2.5 V, and the input voltage VIN=0 V to 5V, the output voltage VQ=0 V to −5 V.

As described above, the amplification circuit 100 according to the present embodiment can output a negative output voltage VQ from input of a positive input voltage VIN. Note that a positive voltage and a negative voltage denote a voltage higher than a certain reference voltage and a voltage lower than the certain reference voltage, respectively, and the reference voltage need not be 0 V. By using the amplification circuit 100 according to the present embodiment in a source driver that drives source lines of an electrooptical panel (for example, a liquid crystal panel) adopting dot inversion driving, the source driver can output a negative gradation voltage from input of a positive gradation voltage (input voltage). Therefore, as will be described later, a gradation voltage generation circuit, a D/A conversion circuit, and the like for negative polarity are unnecessary. This makes it possible to, for example, simplify a circuit configuration of the source driver.

As is apparent from FIG. 3B, a voltage equal to a difference between the input voltage VIN and the second analog reference voltage VN is applied to the first capacitor CA1. For example, in the case where the input voltage VIN=5 V and the second analog reference voltage VN=−2.5 V, a voltage of 7.5 V is applied to the first capacitor CA1. Therefore, a withstand voltage of the first capacitor CA1 needs to be higher than the maximum value of the voltage equal to the difference between the input voltage VIN and the second analog reference voltage VN.

On the other hand, a voltage equal to a difference between the second analog reference voltage VN and the output voltage VQ is applied to the second capacitor CA2. For example, in the case where the output voltage VQ=0 V and the second analog reference voltage VN=−2.5 V, a voltage of 2.5 V is applied to the second capacitor CA2. Also in the case where the output voltage VQ=−5 V and the second analog reference voltage VN=−2.5 V, a voltage of 2.5 V is applied to the second capacitor CA2. As such, a withstand voltage of the second capacitor CA2 can be lower than that of the first capacitor CA1.

A withstand voltage of transistors constituting the switch elements SW1 to SW5 and the operational amplifier OP can be lower than a difference between the first voltage V1 and the third voltage V3, and higher than a difference between the second voltage V2 and the third voltage V3. For example, in the case where the first voltage V1, the second voltage V2 and the third voltage V3 are 5 V, 0 V and −5 V, respectively, the withstand voltage of the transistors can be lower than 10 V and higher than 5 V.

In this way, the amplification circuit 100 according to the present embodiment can be constituted using transistors with an intermediate withstand voltage, e.g. a withstand voltage of approximately 6V. Transistors with an intermediate withstand voltage require a smaller element area and have a higher driving ability than transistors with a high withstand voltage, e.g. a withstand voltage of 10 V or higher. Therefore, the amplification circuit 100 according to the present embodiment can achieve a high driving ability despite requiring a small area.

Figure 4:
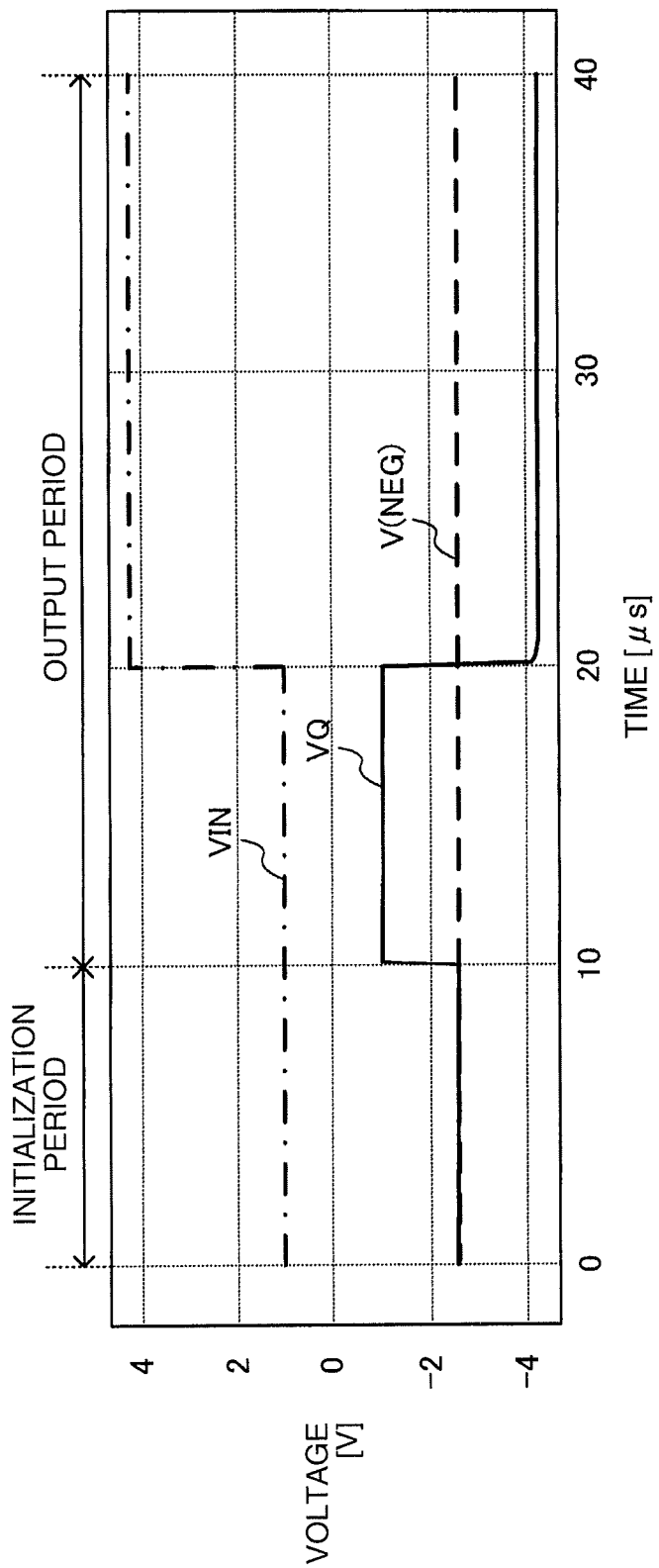
FIG. 4 shows examples of voltage waveforms of the amplification circuit.

FIG. 4 shows examples of voltage waveforms of the amplification circuit 100 according to the present embodiment. More specifically, FIG. 4 shows waveforms of the input voltage VIN, the output voltage VQ, and a voltage V (NEG) of the reference node NEG according to a circuit simulation. Note that FIG. 4 depicts the case where the capacitance value C1 of the first capacitor CA1 is equal to the capacitance value C2 of the second capacitor CA2, and the first analog reference voltage VP and the second analog reference voltage VN are 2.5 V and −2.5 V, respectively.

As shown in FIG. 4, in the initialization period, the switch element SW5 is switched on, and therefore the output voltage VQ equals the voltage V (NEG) of the reference node (in FIG. 4, −2.5 V). In the output period, the output voltage VQ is −1 V when the input voltage VIN is 1 V, and the output voltage VQ is −4.2 V when the input voltage VIN is 4.2 V. These resultant values match the values obtained under the condition that VP=2.5 V and VN=−2.5 V in Equation 8.

2. Source Driver

Figure 5:
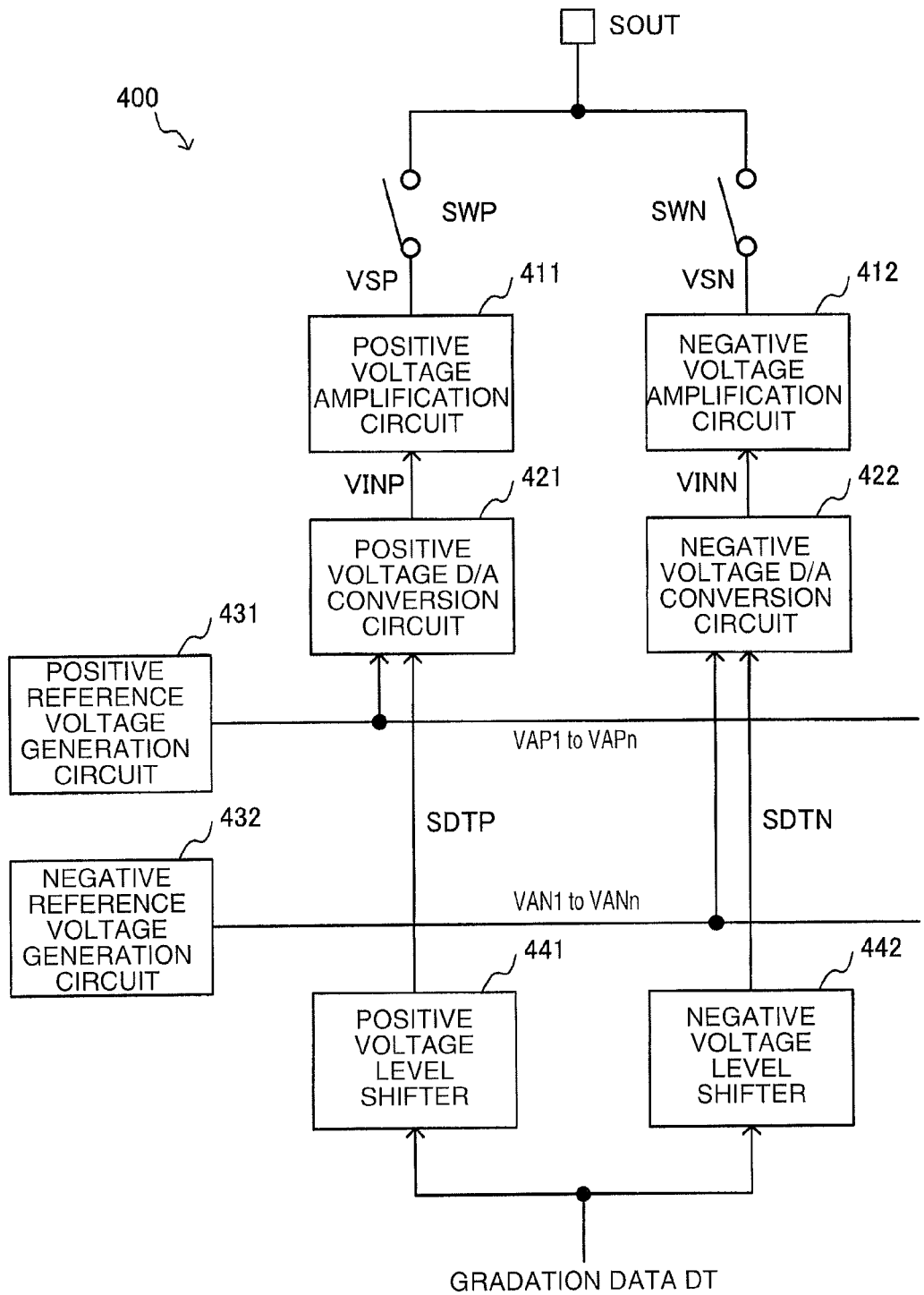
FIG. 5 shows an example of a fundamental configuration of a source driver according to a comparative example.

FIG. 5 shows an example of a fundamental configuration of a source driver 400 that does not use the amplification circuit 100 according to the present embodiment as a comparative example. In FIG. 5, a circuit for driving one source line is shown. Circuits for driving other source lines are omitted from the drawings as they are configured in the same way.

The source driver 400 according to the comparative example includes a positive voltage amplification circuit 411, a positive voltage D/A conversion circuit 421, a positive reference voltage generation circuit 431, a positive voltage level shifter 441, a negative voltage amplification circuit 412, a negative voltage D/A conversion circuit 422, a negative reference voltage generation circuit 432, a negative voltage level shifter 442, and switch elements SWP, SWN.

The positive voltage amplification circuit 411 receives a positive input voltage VINP and outputs a positive driving voltage VSP. The positive voltage amplification circuit 411 can be constituted using, for example, a voltage follower using an operational amplifier.

The positive voltage D/A conversion circuit 421 receives level-shifted gradation data SDTP and positive reference voltages VAP1 to VAPn (n is the number of gradations), and outputs one of the positive reference voltages VAP1 to VAPn that corresponds to the gradation data SDTP to the positive voltage amplification circuit 411.

The positive reference voltage generation circuit 431 generates the positive reference voltages VAP1 to VAPn and outputs them to the positive voltage D/A conversion circuit 421.

The positive voltage level shifter 441 receives gradation data DT, shifts the voltage level of the gradation data DT, and outputs the level-shifted gradation data SDTP to the positive voltage D/A conversion circuit 421.

The negative voltage amplification circuit 412 receives a negative input voltage VINN and outputs a negative driving voltage VSN. The negative voltage amplification circuit 412 can be constituted using, for example, a voltage follower using an operational amplifier.

The negative voltage D/A conversion circuit 422 receives level-shifted gradation data SDTN and negative reference voltages VAN1 to VANn, and outputs one of the negative reference voltages VAN1 to VANn that corresponds to the gradation data SDTN to the negative voltage amplification circuit 412.

The negative reference voltage generation circuit 432 generates the negative reference voltages VAN1 to VANn and outputs them to the negative voltage D/A conversion circuit 422.

The negative voltage level shifter 442 receives the gradation data DT, shifts the voltage level of the gradation data DT, and outputs the level-shifted gradation data SDTN to the negative voltage D/A conversion circuit 422.

In a positive polarity period in which a positive driving voltage is output, the switch element SWP is switched on, and the positive driving voltage VSP, which is an output voltage from the positive voltage amplification circuit 411, is output to an output terminal SOUT.

In a negative polarity period in which a negative driving voltage is output, the switch element SWN is switched on, and the negative driving voltage VSN, which is an output voltage from the negative voltage amplification circuit 412, is output to the output terminal SOUT.

For example, the positive driving voltage VSP falls in a range of 0 V to 5 V. Accordingly, the positive input voltage VINP, the level-shifted gradation data SDTP, and the positive reference voltages VAP1 to VAPn also fall within a range of 0 V to 5 V. On the other hand, for example, the negative driving voltage VSN is 0 V to −5 V. Accordingly, the negative input voltage VINN, the level-shifted gradation data SDTN, and the negative reference voltages VAN1 to VANn also fall within a range of 0 V to −5 V.

As described above, in the source driver 400 according to the comparative example, a circuit for positive polarity and a circuit for negative polarity operate in different voltage ranges, and therefore all or a part of these circuits cannot be mutually realized. As a result, an area occupied by circuits increases.

Furthermore, as the negative voltage level shifter 442 shifts the voltage level of the gradation data DT that falls in a voltage range of, for example, 0 V to 1.8 V to the voltage level of the gradation data SDTN that falls in a voltage range of, for example, 0 V to −5 V, the negative voltage level shifter 442 needs to be constituted using transistors with a withstand voltage of, for example, 10 V or higher (high withstand voltage). As transistors with a high withstand voltage require a larger element area than transistors with an intermediate withstand voltage (for example, a withstand voltage of approximately 6 V), they contribute to a further increase in an area occupied by the circuits.

Figure 6:
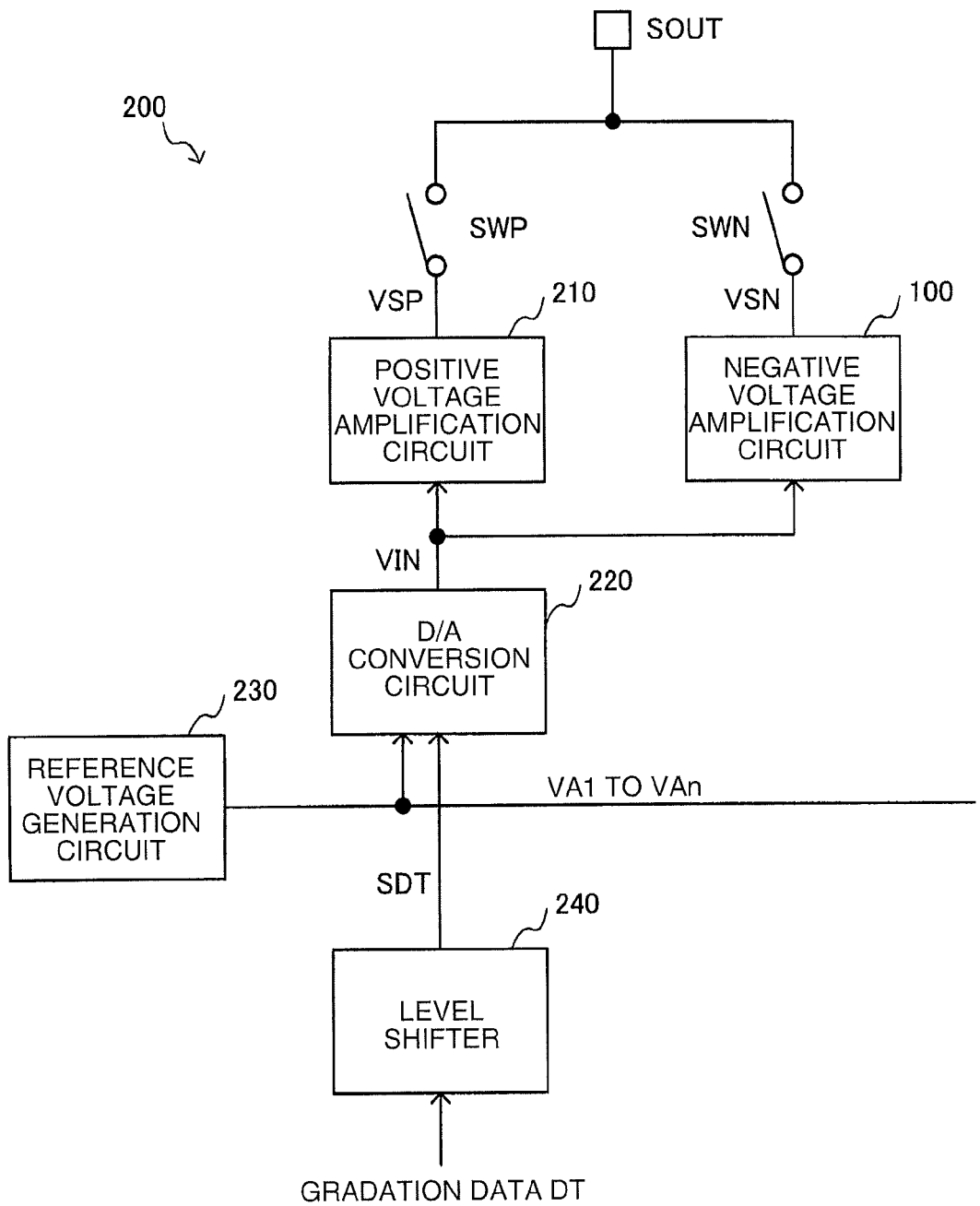
FIG. 6 shows an example of a fundamental configuration of a source driver.

FIG. 6 shows an example of a fundamental configuration of a source driver 200 according to the present embodiment. The source driver 200 according to the present embodiment includes a positive voltage amplification circuit 210 (broadly speaking, a second amplification circuit), a negative voltage amplification circuit 100, a D/A conversion circuit 220, a reference voltage generation circuit 230, a level shifter 240, and switch elements SWP, SWN. It should be noted that the source driver 200 according to the present embodiment is not limited to the configuration of FIG. 6, and may be embodied with various modifications. For example, a part of constituent elements thereof may be omitted or replaced with other constituent elements, and other constituent elements may be added.

In FIG. 6, a circuit for driving one source line is shown. Circuits for driving other source lines are omitted from the drawings as they are configured in the same way.

The positive voltage amplification circuit 210 receives an input voltage VIN and outputs a positive driving voltage VSP. The positive voltage amplification circuit 210 can be constituted using, for example, a voltage follower using an operational amplifier. Alternatively, the positive voltage amplification circuit 210 may have a circuit configuration similar to that of the amplification circuit 100 according to the present embodiment, as will be described later. In a positive polarity period of dot inversion driving (broadly speaking, a second period), the positive voltage amplification circuit 210 drives a source line of an electrooptical panel.

The negative voltage amplification circuit 100 receives the input voltage VIN and outputs a negative driving voltage VSN. The above-described amplification circuit 100 according to the present embodiment (FIG. 1) is used as the negative voltage amplification circuit 100. As the amplification circuit 100 has already been described, a detailed description thereof is omitted here. In a negative polarity period of dot inversion driving (broadly speaking, a first period), the negative voltage amplification circuit 100 drives a source line of the electrooptical panel.

The D/A conversion circuit 220 receives level-shifted gradation data SDT and reference voltages VA1 to VAn (n is the number of gradations), and outputs one of the reference voltages VA1 to VAn that corresponds to the gradation data SDT to the positive voltage amplification circuit 210 and the negative voltage amplification circuit 100.

The reference voltage generation circuit 230 generates the reference voltages VA1 to VAn and outputs them to the D/A conversion circuit 220. Note that the reference voltage generation circuit 230 may be provided outside the source driver 200, instead of being included in the source driver 200.

The level shifter 240 receives gradation data DT, shifts the voltage level of the gradation data DT, and outputs the level-shifted gradation data SDT to the D/A conversion circuit 220. The voltage level of the gradation data DT is, for example, 0 V to 1.8 V, and the voltage level of the level-shifted gradation data SDT is 0 V to 5 V.

In a positive polarity period in which a positive driving voltage is output, the switch element SWP is switched on, and the positive driving voltage VSP, which is an output voltage from the positive voltage amplification circuit 210, is output to an output terminal SOUT.

In a negative polarity period in which a negative driving voltage is output, the switch element SWN is switched on, and the negative driving voltage VSN, which is an output voltage from the negative voltage amplification circuit 100, is output to the output terminal SOUT.

For example, the positive driving voltage VSP falls in a range of 0 V to 5 V, and the negative driving voltage VSN is 0 V to −5 V. The input voltage VIN, the level-shifted gradation data SDT, and the reference voltages VA1 to VAn fall in a range of 0 V to 5 V.

As described above, in the source driver 200 according to the present embodiment, the amplification circuit 100 can output the negative driving voltage VSN from input of the positive input voltage VIN, and therefore a D/A conversion circuit and a reference voltage generation circuit for negative polarity are unnecessary. As a result, an area occupied by circuits can be reduced. Furthermore, a level shifter for negative polarity constituted using transistors with a high withstand voltage is also unnecessary. As circuits can be constituted using transistors with an intermediate withstand voltage, an area occupied by circuits can be further reduced.

FIG. 7A shows an example of a configuration of the positive voltage amplification circuit 210 (broadly speaking, the second amplification circuit) used in the source driver 200 according to the present embodiment. The positive voltage amplification circuit 210 includes a second operational amplifier OP2, a third capacitor CA3, a fourth capacitor CA4, and sixth to tenth switch elements SW6 to SW10. It should be noted that the positive voltage amplification circuit 210 according to the present embodiment is not limited to the configuration of FIG. 7A, and may be embodied with various modifications. For example, a part of constituent elements thereof may be omitted or replaced with other constituent elements, and other constituent elements may be added.

A second reference node NEG2 is connected to an inverting input terminal (−) of the second operational amplifier OP2 (broadly speaking, a first input terminal). A supply node NVP of a first analog reference voltage VP is connected to a non-inverting input terminal (+) of the second operational amplifier OP2 (broadly speaking, a second input terminal). Furthermore, a high-potential power supply voltage VDH2 (broadly speaking, a first power supply voltage) and a low-potential power supply voltage VDL2 (broadly speaking, a second power supply voltage) are supplied to the operational amplifier OP2. An output terminal of the operational amplifier OP2 is connected to an output node NQ2 of a second output voltage VQ2.

The third capacitor CA3 is provided between a third node N3 and the reference node NEG2. The third capacitor CA3 can be constituted using, for example, a metal-insulator-metal capacitor.

The fourth capacitor CA4 is provided between a fourth node N4 and the reference node NEG2. The fourth capacitor CA4 can be constituted using, for example, a metal-insulator-metal capacitor.

The sixth switch element SW6 is provided between the third node N3 and an input node NVIN of an input voltage VIN. The seventh switch element SW7 is provided between the third node N3 and a supply node NVP of a first analog reference voltage VP.

The eighth switch element SW8 is provided between the fourth node N4 and the output node NQ2 of the output voltage VQ2. The ninth switch element SW9 is provided between the fourth node N4 and a supply node NVP of a first analog reference voltage VP. The tenth switch element SW10 is provided between the output node NQ2 of the output voltage VQ2 and the reference node NEG2.

The high-potential power supply voltage VDH2 of the operational amplifier OP2 is one of the first voltage V1 and the second voltage V2 having a higher potential. The low-potential power supply voltage VDL2 of the operational amplifier OP2 is one of the first voltage V1 and the second voltage V2 having a lower potential. For example, in the case where the first voltage V1, the second voltage V2 and the third voltage V3 are 5 V, 0 V and −5 V, respectively, the high-potential power supply voltage VDH2 and the low-potential power supply voltage VDL2 of the second operational amplifier OP2 are 5 V and 0 V, respectively.

FIGS. 7B and 7C are drawings for describing the operations of the positive voltage amplification circuit 210 in the initialization period and the output period.

In the initialization period, the switch elements SW7, SW9, SW10 are switched on, and other switch elements SW6, SW8 are switched off. Similarly to the amplification circuit 100, an imaginary short-circuit function of the operational amplifier OP2 sets the reference node NEG2 at the first analog reference voltage VP.

As shown in FIG. 7B, provided that a capacitance value of the third capacitor CA3 is C3 and a capacitance value of the fourth capacitor CA4 is C4, an electric charge Q3 accumulated in the capacitor CA3 in the initialization period is given by the following equation.

$$Q3 = C3 \cdot (VP - VP) = 0 \qquad \text{Equation 9}$$

An electric charge Q4 accumulated in the capacitor CA4 is given by the following equation.

$$Q4 = C4 \cdot (VP - VP) = 0 \qquad \text{Equation 10}$$

In the output period, SW6 and SW8 are switched on, and other switch elements SW7, SW9, SW10 are switched off. Due to the on state of the switch element SW6, the third capacitor CA3, which is connected to the reference node NEG2 at one end, is set at the input voltage VIN at the other end. Likewise, due to the on state of the switch element SW8, the fourth capacitor CA4, which is connected to the reference node NEG2 at one end, is set at the output voltage VQ2 (output from OP2) at the other end.

As shown in FIG. 7C, an electric charge Q3' accumulated in the capacitor CA3 in the output period is given by the following equation.

$$Q3' = C3 \cdot (VIN - VP) \qquad \text{Equation 11}$$

An electric charge Q4' accumulated in the capacitor CA4 is given by the following equation.

$$Q4' = C4 \cdot (VP - VQ2) \qquad \text{Equation 12}$$

As the reference node NEG2 is placed in a high impedance state in the output period, an electric charge accumulated in the reference node NEG2 is stored. That is to say, the electric charge accumulated in the reference node NEG2 is the same in the initialization period and the output period.

Therefore, based on the principle of charge conservation, the following equation holds.

$$-Q3 + Q4 = -Q3' + Q4' \qquad \text{Equation 13}$$

The following equation is obtained by substituting Equations 9 to 11 into Equation 13.

$$-C3 \cdot (VIN - VP) + C4 \cdot (VP - VQ2) = 0 \qquad \text{Equation 14}$$

Based on Equation 6, the output voltage VQ is given by the following equation.

$$VQ2 = VP - (C3/C4) \cdot (VIN - VP) \qquad \text{Equation 15}$$

In the case where C3=C4, the following equation holds.

$$VQ2 = 2 \cdot VP - VIN \qquad \text{Equation 16}$$

For example, in the case where the first analog reference voltage VP=2.5 V and the input voltage VIN=0 V to 5 V, the output voltage VQ2=5 V to 0 V.

As described above, in the positive voltage amplification circuit 210 according to the present embodiment, the input voltage VIN and the output voltage VQ2 are inverted. Therefore, as will be described later, it is necessary to invert the gradation data DT in the positive polarity period.

Figure 8:
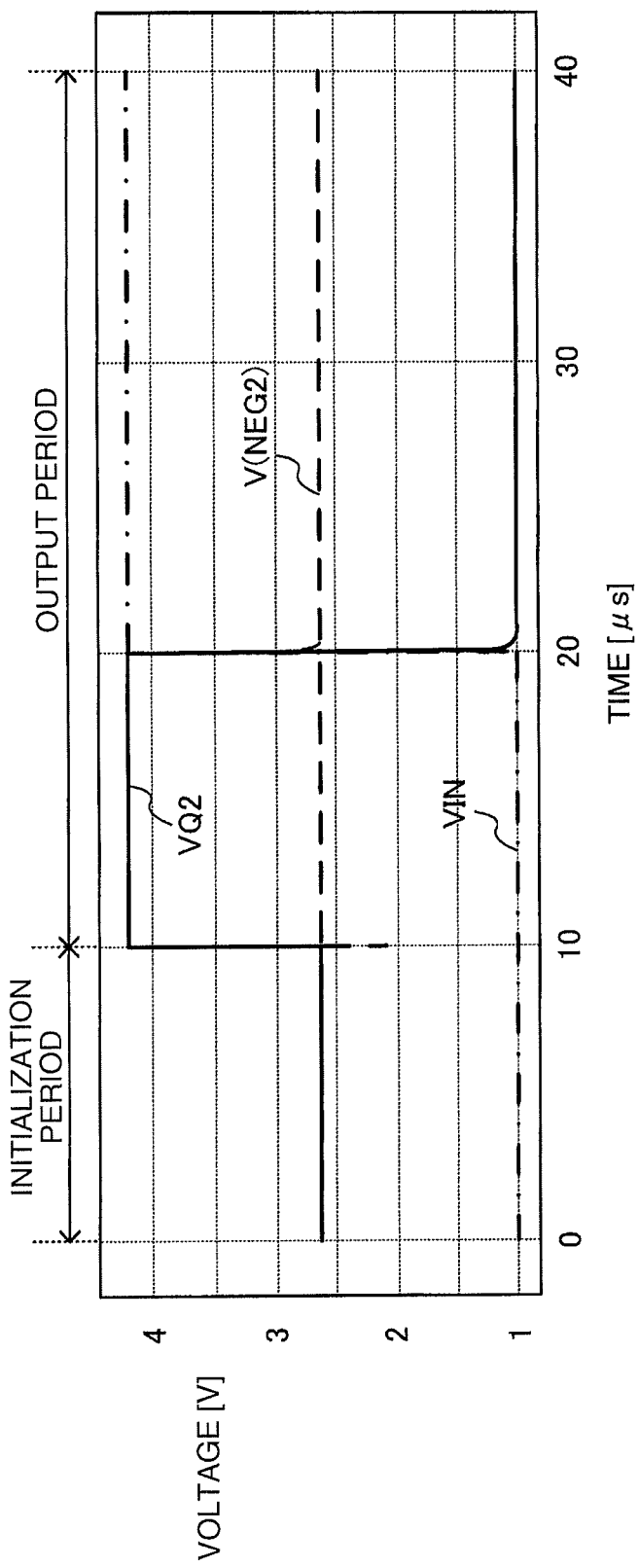
FIG. 8 shows examples of voltage waveforms of the positive voltage amplification circuit.

FIG. 8 shows examples of voltage waveforms of the positive voltage amplification circuit 210. More specifically, FIG. 8 shows waveforms of the input voltage VIN, the output voltage VQ2, and a voltage V (NEG2) of the reference node NEG2 according to a circuit simulation. Note that FIG. 8 depicts the case where the capacitance value C3 of the third capacitor CA3 is equal to the capacitance value C4 of the fourth capacitor CA4, and the first analog reference voltage VP is 2.6 V.

As shown in FIG. 8, in the initialization period, the switch element SW10 is switched on, and therefore the output voltage VQ2 equals the voltage V (NEG2) of the reference node (in FIG. 8, 2.6 V). In the output period, the output voltage VQ2 is 4.2 V when the input voltage VIN is 1 V, and the output voltage VQ2 is 1 V when the input voltage VIN is 4.2 V. These resultant values match the values obtained under the condition that VP=2.6 V in Equation 16.

Figure 9A:
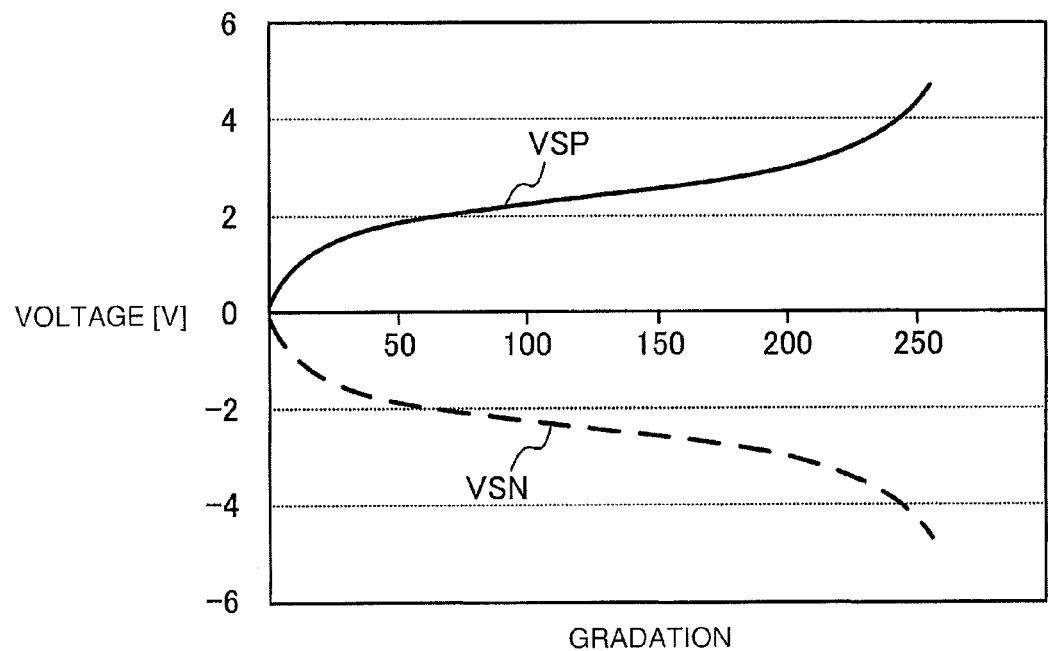
FIGS. 9A and 9B are diagrams for describing a reference voltage VA.
Figure 9B:
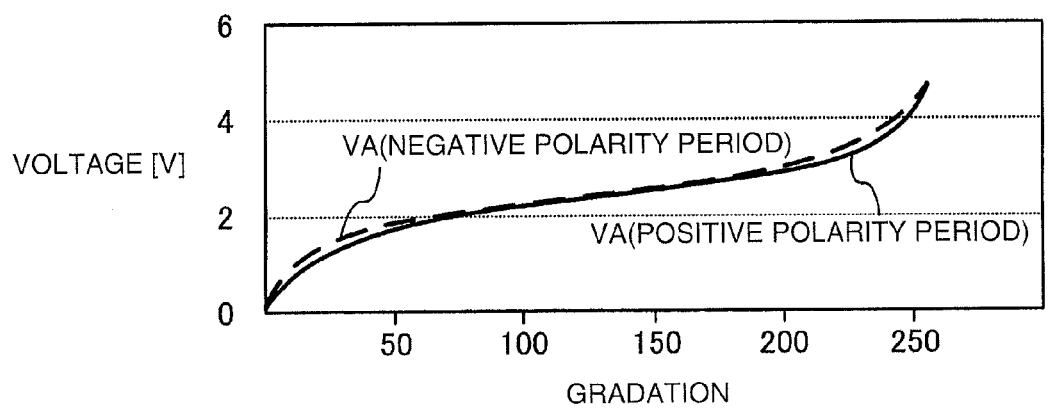

FIGS. 9A and 9B are diagrams for describing a reference voltage VA (VAP1 to VAPn) generated by the reference voltage generation circuit 230 of the source driver 200 according to the present embodiment. For the sake of simplicity, it will be assumed below that the capacitors CA1, CA2 have the same capacitance value, the capacitors CA3, CA4 have the same capacitance value, the first analog reference voltage VP=2.5 V, and the second analog reference voltage VN=−2.5 V.

As described above, the positive voltage amplification circuit 210 shown in FIG. 7A outputs the output voltage VQ2=2·VP−VIN as the positive driving voltage VSP from input of the input voltage VIN. On the other hand, the amplification circuit 100 shown in FIG. 1 (the negative voltage amplification circuit) outputs the output voltage VQ=VN−VIN+VP as the negative driving voltage VSN from input of the input voltage VIN. For example, in the case where VP=2.5 V and VN=−2.5 V, VQ2=5−VIN and VQ=−VIN. Therefore, it is necessary to make the reference voltage VA generated by the reference voltage generation circuit 230 vary between the positive polarity period and the negative polarity period.

FIG. 9A shows examples of the positive driving voltage VSP and the negative driving voltage VSN output from the source driver 200. FIG. 9B shows examples of the reference voltage VA generated by the reference voltage generation circuit 230.

In the positive polarity period, inversion of the gradation data enables the positive voltage amplification circuit 210 to output a gradation voltage VSP indicated by a solid line in FIG. 9A from input of the reference voltage VA indicated by a solid line in FIG. 9B. For example, in the case of 256 gradations, the inverted gradation data is 255 when the original gradation data is 0, and the inverted gradation data is 0 when the original gradation data is 255.

In the negative polarity period, without inversion of the gradation data, the negative voltage amplification circuit 100 can output a gradation voltage VSN indicated by a dashed line in FIG. 9A from input of the reference voltage VA indicated by a dashed line in FIG. 9B. The reference voltage VA indicated by the dashed line in FIG. 9B is obtained by inverting the polarity of the gradation voltage VSN indicated by the dashed line in FIG. 9A. As is apparent from FIG. 9B, the reference voltage VA generated by the reference voltage generation circuit 230 varies between the positive polarity period and the negative polarity period.

Figure 10:
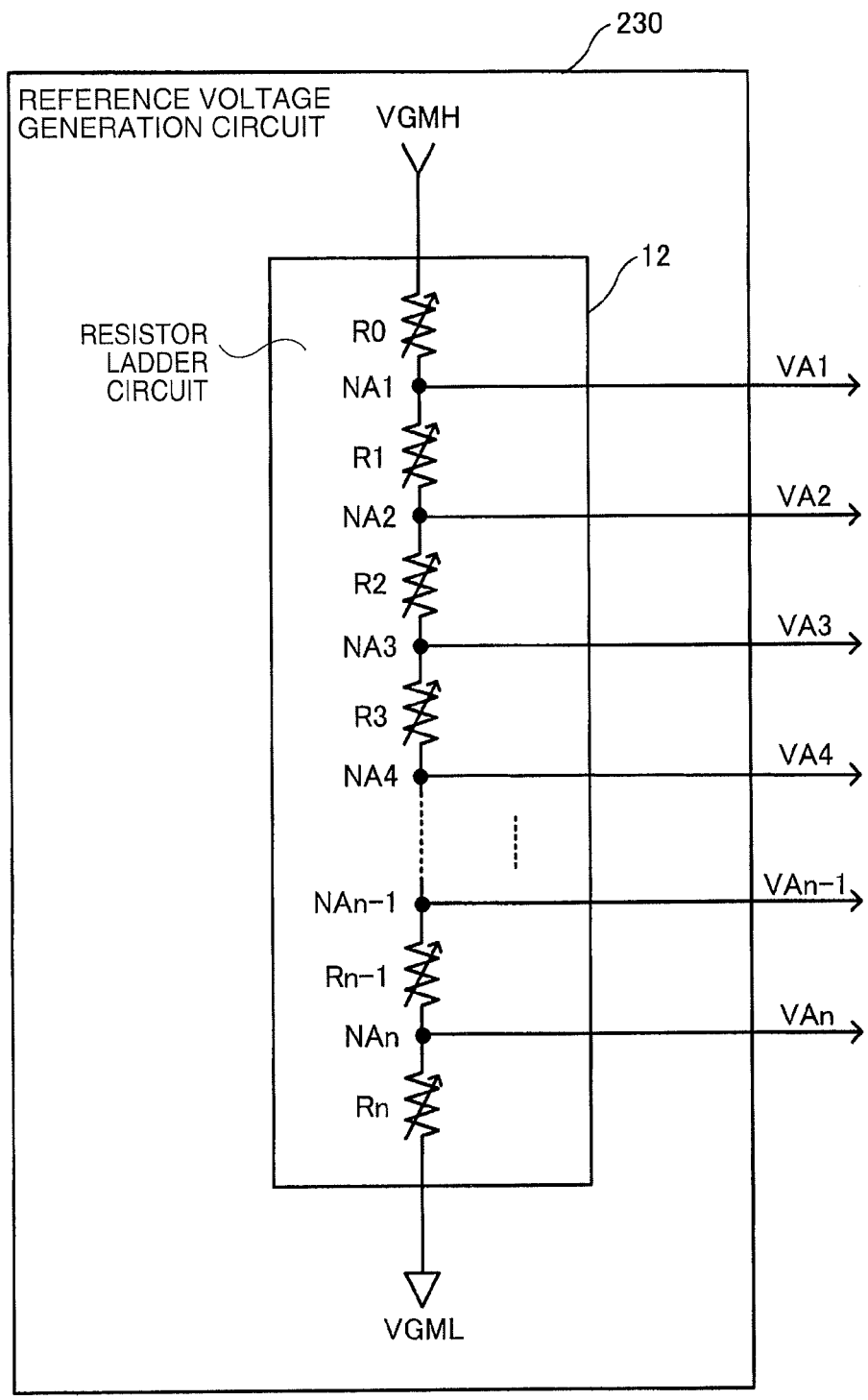
FIG. 10 shows an example of a configuration of a reference voltage generation circuit.

FIG. 10 shows an example of a configuration of the reference voltage generation circuit 230. It should be noted that the reference voltage generation circuit 230 according to the present embodiment is not limited to the configuration of FIG. 10, and may be embodied with various modifications. For example, a part of constituent elements thereof may be omitted or replaced with other constituent elements, and other constituent elements may be added.

A resistor ladder circuit 12 is a voltage generation circuit provided between a high-potential power supply VGMH and a low-potential power supply VGML that serve as reference voltages. The resistor ladder circuit 12 includes a plurality of resistor circuits (variable resistors) R0 to Rn connected in series (n is an integer equal to or greater than two). Voltages of a plurality of voltage division nodes NA1 to NAn corresponding to divided resistances of the plurality of resistor circuits R0 to Rn are output as the reference voltages VA1 to VAn. The resistor circuits R0 to Rn can be set such that their resistance values vary between the positive polarity period and the negative polarity period.

Figure 11:
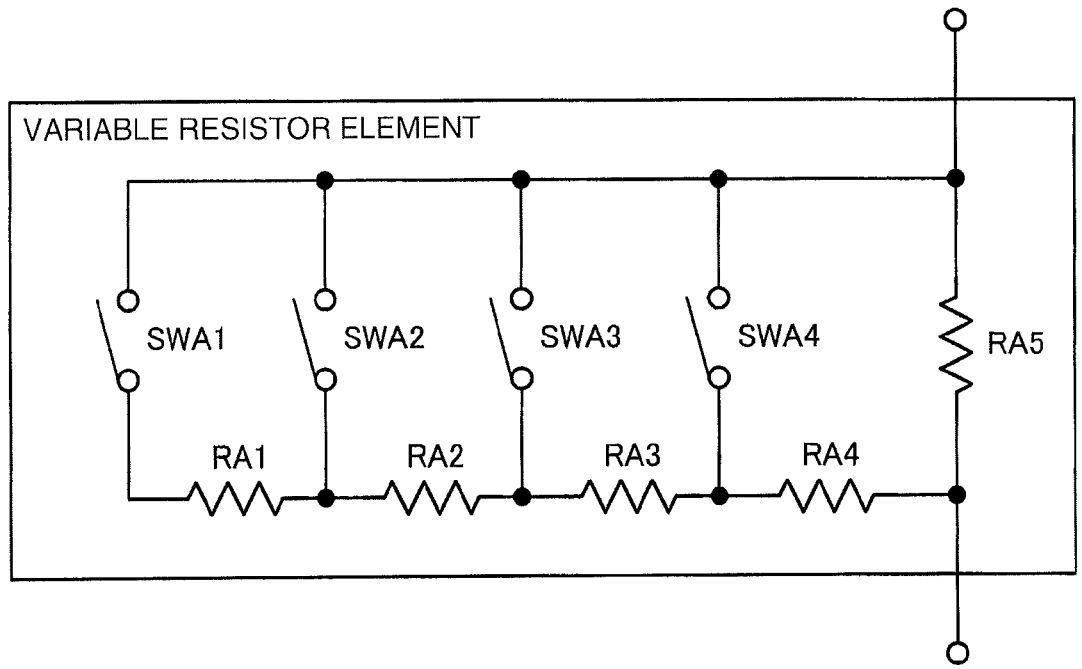
FIG. 11 shows an example of a configuration of a resistor circuit.

FIG. 11 shows an example of a configuration of a resistor circuit Ri (i is an integer satisfying the relationship 0≤i≤n). The resistor circuit Ri includes resistor elements RA1 to RA5 and switch elements SWA1 to SWA4. It should be noted that the resistor circuit Ri according to the present embodiment is not limited to the configuration of FIG. 11, and may be embodied with various modifications. For example, a part of constituent elements thereof may be omitted or replaced with other constituent elements, and other constituent elements may be added.

By switching on and off the switch elements SWA1 to SWA4, the resistor circuits R0 to Rn can be set such that their resistance values vary between the positive polarity period and the negative polarity period. This makes it possible to generate the reference voltages VA1 to VAn that vary between the positive polarity period and the negative polarity period as shown in FIG. 9B. The switch elements SWA1 to SWA4 are switched on and off by a switch control signal from a switch control signal generation circuit, which is not shown in the drawings.

It should be noted that the number of resistor elements and the number of switch elements included in the resistor circuit Ri are not limited to those shown in FIG. 11.

As described above, in the source driver 200 according to the present embodiment, the negative voltage amplification circuit 100 can output the negative driving voltage from input of the positive input voltage, and therefore a D/A conversion circuit and a reference voltage generation circuit for negative polarity are unnecessary. As a result, an area occupied by circuits can be reduced. Furthermore, a level shifter for negative polarity constituted using transistors with a high withstand voltage is also unnecessary. As circuits can be constituted using transistors with an intermediate withstand voltage, an area occupied by circuits can be further reduced. As a result, for example, the design cost and the manufacturing cost can be reduced.

The following describes an embodiment of a circuit device according to the invention and a source driver including the circuit device with reference to FIGS. 12 to 23. It should be noted that a later-described switching circuit including switch elements SW2, SW4, SW6 in a source driver 1200 shown in FIG. 18 corresponds to the switch element SWP in the source driver 200 shown in FIG. 6. Similarly, a later-described switching circuit including switch elements SW1, SW3, SW5 in the source driver 1200 shown in FIG. 18 corresponds to the switch element SWN in the source driver 200 shown in FIG. 6. Furthermore, a later-described second amplification circuit AMP2 in the source driver 1200 shown in FIG. 18 corresponds to the positive voltage amplification circuit 210 in the source driver 200 shown in FIG. 6. Similarly, a later-described first amplification circuit AMP1 in the source driver 1200 shown in FIG. 18 corresponds to the negative voltage amplification circuit 100 in the source driver 200 shown in FIG. 6. Therefore, a later-described driving signal output terminal PS shown in FIG. 18 corresponds to the output terminal SOUT shown in FIG. 6.

3. Circuit Device

Figure 12:
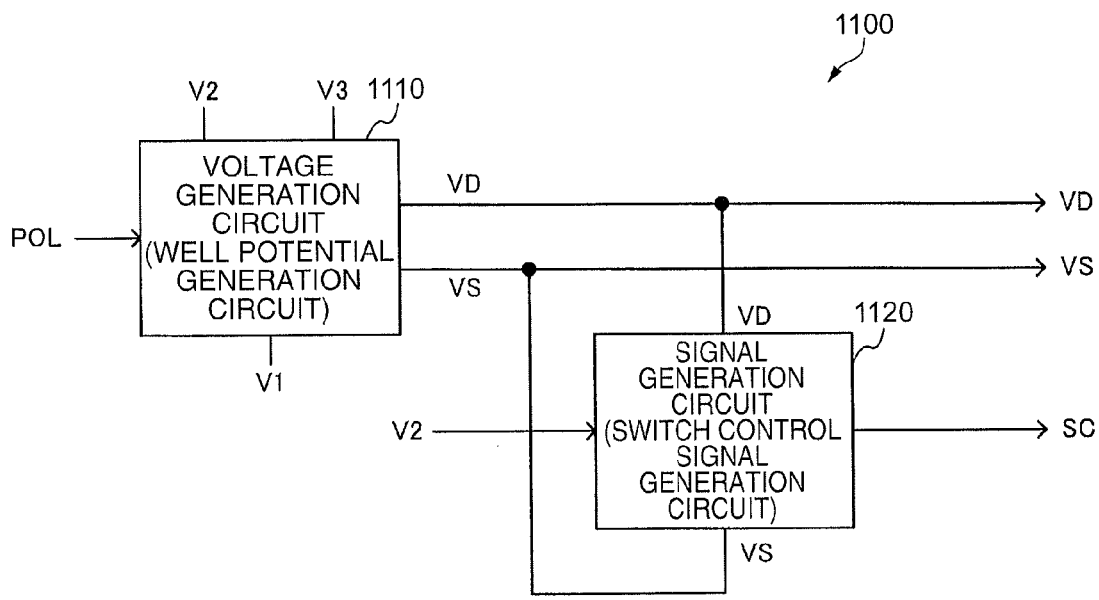
FIG. 12 shows an example of a fundamental configuration of a circuit device.

FIG. 12 shows an example of a fundamental configuration of a circuit device 1100 according to the present embodiment. The circuit device 1100 according to the present embodiment includes a voltage generation circuit 1110 and a signal generation circuit 1120. It should be noted that the circuit device 1100 according to the present embodiment is not limited to the configuration of FIG. 12, and may be embodied with various modifications. For example, a part of constituent elements thereof may be omitted or replaced with other constituent elements, and other constituent elements may be added.

As will be described later, the signal generation circuit 1120 is a switch control signal generation circuit that outputs a switch control signal SC in a source driver that drives source lines of an electrooptical panel through dot inversion driving. The switch control signal SC controls on and off of switch elements that switch between a positive driving signal and a negative driving signal. On the other hand, the voltage generation circuit 1110 is a well potential generation circuit that outputs a first supply voltage VS and a second supply voltage VD to a P-type well and an N-type well of transistors constituting switch elements, respectively.

The voltage generation circuit 1110 generates and outputs the first supply voltage VS that changes in a range between a first power supply voltage V1 serving as the first voltage and a second power supply voltage V2 serving as the second voltage. The voltage generation circuit 1110 also generates and outputs the second supply voltage VD that changes in a range between the second power supply voltage V2 and a third power supply voltage V3 serving as the third voltage. Note that the second power supply voltage V2 is higher than the first power supply voltage V1, and the third power supply voltage V3 is higher than the second power supply voltage V2. The first supply voltage VS changes in a range between the first power supply voltage V1 and the second power supply voltage V2, for example, on a periodic basis. The second supply voltage VD changes in a range between the second power supply voltage V2 and the third power supply voltage V3, for example, on a periodic basis. The voltage generation circuit 1110 is placed in a first state or a second state based on a state switching signal POL.

More specifically, as shown in FIG. 12, when the state switching signal POL is at the voltage level of the second power supply voltage V2, the voltage generation circuit 1110 is placed in the first state. When the state switching signal POL is at the voltage level of the first power supply voltage V1, the voltage generation circuit 1110 is placed in the second state. In the first state, the voltage generation circuit 1110 outputs the voltage level of the first power supply voltage V1 as the first supply voltage VS, and outputs the voltage level of the second power supply voltage V2 as the second supply voltage VD. On the other hand, in the second state, the voltage generation circuit 1110 outputs the voltage level of the second power supply voltage V2 as the first supply voltage VS, and outputs the voltage level of the third power supply voltage V3 as the second supply voltage VD.

In this way, based on the state switching signal POL, the voltage generation circuit 1110 switches from the first state to the second state, or from the second state to the first state. This enables switching of the potential of the P-type well and the potential of the N-type well.

The signal generation circuit 1120 includes inverters to which the first supply voltage VS and the second supply voltage VD are supplied as a low-potential power supply and a high-potential power supply, respectively. Also, the second power supply voltage V2 is input to the gates of these inverters. As shown in FIG. 12, when the voltage generation circuit 1110 is in the first state, the signal generation circuit 1120 outputs a signal at the voltage level of the first power supply voltage V1 as the switch control signal SC. On the other hand, when the voltage generation circuit 1110 is in the second state, the signal generation circuit 1120 outputs a signal at the voltage level of the third power supply voltage V3 as the switch control signal SC.

For example, the first power supply voltage V1, the second power supply voltage V2 and the third power supply voltage V3 are 0 V, 5 V and 10 V, respectively. As will be described later, in the case where V1=0 V, V2=5 V and V3=10 V, the voltage of a positive driving signal output from the source driver falls in a range of 5 V to 10 V, and the voltage of a negative driving signal output from the source driver falls in a range of 0 V to 5 V. It should be noted that the first power supply voltage V1, the second power supply voltage V2 and the third power supply voltage V3 are not limited to the above-referenced voltages, and may be, for example, −5 V, 0 V and 5 V, respectively.

Figure 13:
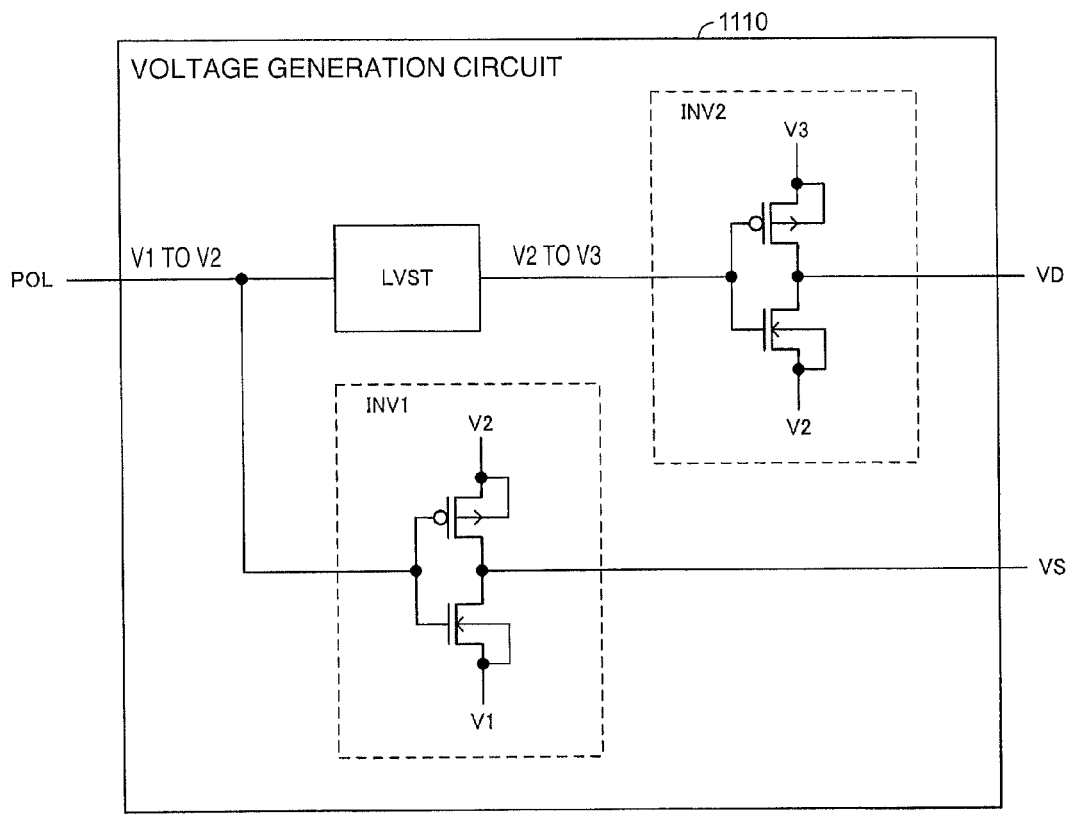
FIG. 13 shows a first configuration example of a voltage generation circuit.

FIG. 13 shows a first configuration example of the voltage generation circuit 1110 according to the present embodiment. The voltage generation circuit 1110 according to the first configuration example includes a first inverter INV1, a second inverter INV2, and a level shifter LVST. It should be noted that the voltage generation circuit 1110 according to the present embodiment is not limited to the configuration of FIG. 13, and may be embodied with various modifications. For example, a part of constituent elements thereof may be omitted or replaced with other constituent elements, and other constituent elements may be added.

The first power supply voltage V1 and the second power supply voltage V2 are supplied to the first inverter INV1 as a low-potential power supply and a high-potential power supply, respectively. Also, the first inverter INV1 receives the state switching signal POL as input, and outputs the first supply voltage VS. More specifically, the first inverter INV1 outputs the voltage level of the first power supply voltage V1 as the first supply voltage VS when the state switching signal POL is at the voltage level of the second power supply voltage V2, that is to say, in the first state. On the other hand, the first inverter INV1 outputs the voltage level of the second power supply voltage V2 as the first supply voltage VS when the state switching signal POL is at the voltage level of the first power supply voltage V1, that is to say, in the second state.

The second power supply voltage V2 and the third power supply voltage V3 are supplied to the second inverter INV2 as a low-potential power supply and a high-potential power supply, respectively. Also, the second inverter INV2 receives output from the level shifter LVST as input, and outputs the second supply voltage VD. More specifically, the level shifter LVST outputs the voltage level of the third power supply voltage V3 and the second inverter INV2 outputs the voltage level of the second power supply voltage V2 as the second supply voltage VD when the state switching signal POL is at the voltage level of the second power supply voltage V2, that is to say, in the first state. On the other hand, the level shifter LVST outputs the voltage level of the second power supply voltage V2 and the second inverter INV2 outputs the voltage level of the third power supply voltage V3 as the second supply voltage VD when the state switching signal POL is at the voltage level of the first power supply voltage V1, that is to say, in the second state.

The level shifter LVST receives the state switching signal POL, and outputs a signal obtained by shifting the voltage level of the state switching signal POL to the second inverter INV2. More specifically, the level shifter LVST shifts the state switching signal POL at the voltage level of the first power supply voltage V1 to the voltage level of the second power supply voltage V2, and outputs the resultant signal. The level shifter LVST also shifts the state switching signal POL at the voltage level of the second power supply voltage V2 to the voltage level of the third power supply voltage V3, and outputs the resultant signal.

A voltage equal to a difference between the second power supply voltage V2 and the first power supply voltage V1 is applied to P-type and N-type transistors constituting the first inverter INV1. On the other hand, a voltage equal to a difference between the third power supply voltage V3 and the second power supply voltage V2 is applied to P-type and N-type transistors constituting the second inverter INV2. Therefore, a withstand voltage of the transistors constituting the first inverter INV1 and the second inverter INV2 can be lower than a difference between the first power supply voltage V1 and the third power supply voltage V3. For example, in the case where V1=0 V, V2=5 V and V3=10 V, a withstand voltage of the transistors constituting the first inverter INV1 and the second inverter INV2 can be lower than 10 V.

Figure 14:
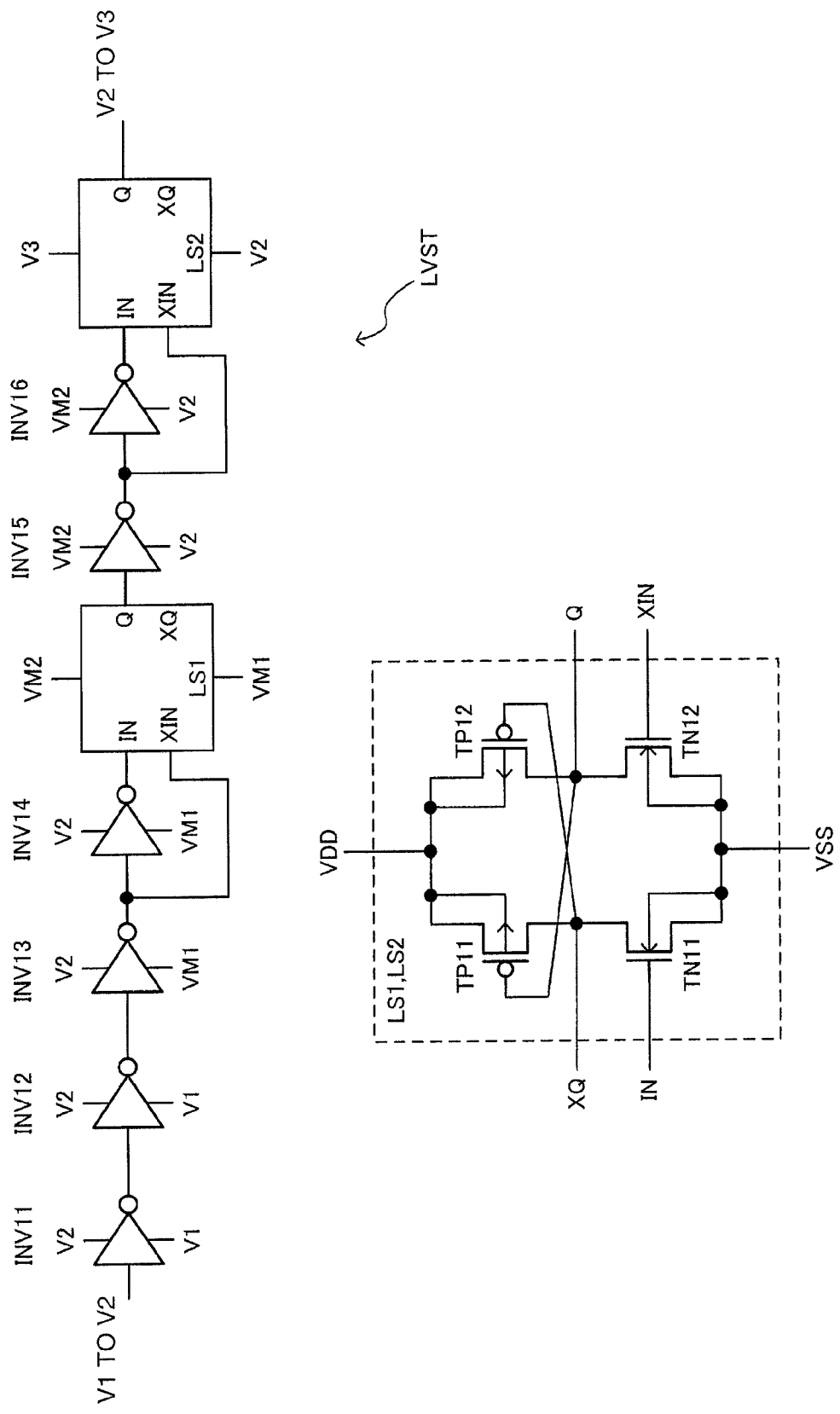
FIG. 14 shows an example of a configuration of a level shifter.

FIG. 14 shows an example of a configuration of the level shifter LVST included in the voltage generation circuit 1110 according to the present embodiment. The level shifter LVST includes six inverters INV11 to INV16 and two shift circuits LS1, LS2. It should be noted that the level shifter LVST according to the present embodiment is not limited to the configuration of FIG. 14, and may be embodied with various modifications. For example, a part of constituent elements thereof may be omitted or replaced with other constituent elements, and other constituent elements may be added.

The level shifter LVST shifts the state switching signal POL at the voltage level of the first power supply voltage V1 to the voltage level of the second power supply voltage V2, and outputs the resultant signal. The level shifter LVST also shifts the state switching signal POL at the voltage level of the second power supply voltage V2 to the voltage level of the third power supply voltage V3, and outputs the resultant signal.

The first power supply voltage V1 serving as a low-potential power supply and the second power supply voltage V2 serving as a high-potential power supply are supplied to the inverters INV11, INV12. A first intermediate voltage VM1 serving as a low-potential power supply and the second power supply voltage V2 serving as a high-potential power supply are supplied to the inverters INV13, INV14. The second power supply voltage V2 serving as a low-potential power supply and a second intermediate voltage VM2 serving as a high-potential power supply are supplied to the inverters INV15, INV16.

The shift circuit LS1 includes N-type transistors TN11, TN12 and P-type transistors TP11, TP12. The shift circuit LS2 is configured in the same manner as the shift circuit LS1. The first intermediate voltage VM1 serving as a low-potential power supply and the second intermediate voltage VM2 serving as a high-potential power supply are supplied to the shift circuit LS1. The second power supply voltage V2 serving as a low-potential power supply and a third power supply voltage V3 serving as a high-potential power supply are supplied to the shift circuit LS2.

The first intermediate voltage VM1 is an intermediate voltage between the first power supply voltage V1 and the second power supply voltage V2. The second intermediate voltage VM2 is an intermediate voltage between the second power supply voltage V2 and the third power supply voltage V3. For example, in the case where V1=0 V, V2=5 V and V3=10 V, VM1 and VM2 can be 2.5 V and 7.5 V, respectively. The first intermediate voltage VM1 can be generated, for example, by a resistive divider circuit using resistor elements based on the first power supply voltage V1 and the second power supply voltage V2. Similarly, the second intermediate voltage VM2 can be generated, for example, by a resistive divider circuit using resistor elements based on the second power supply voltage V2 and the third power supply voltage V3. The resistive divider circuits may use P-type or N-type transistors instead of the resistor elements.

When V1 is input to an input node of the inverter INV11, the inverter INV13 outputs V2, and the inverter INV14 outputs VM1. VM1 and V2 are input to input nodes IN and XIN of the shift circuit LS1, respectively. VM1 is output to an output node Q of the shift circuit LS1. Then, the inverter INV15 outputs VM2, and the inverter INV16 outputs V2. V2 and VM2 are input to input nodes IN and XIN of the shift circuit LS2, respectively. V2 is output to an output node Q of the shift circuit LS2.

When V2 is input to the input node of the inverter INV11, the inverter INV13 outputs VM1, and the inverter INV14 outputs V2. V2 and VM1 are input to the input nodes IN and XIN of the shift circuit LS1, respectively. VM2 is output to the output node Q of the shift circuit LS1. Then, the inverter INV15 outputs V2, and the inverter INV16 outputs VM2. VM2 and V2 are input to the input nodes IN and XIN of the shift circuit LS2, respectively. V3 is output to the output node Q of the shift circuit LS2.

In this way, the level shifter LVST according to the present embodiment can shift the input voltage V1 to V2 and output V2, and can shift the input voltage V2 to V3 and output V3.

The following pairs are supplied to the inverters INV11 to INV16 and the shift circuits LS1, LS2 constituting the level shifter LVST as power supply voltages: V1 and V2; VM1 and V2; VM1 and VM2; V2 and VM2; and V2 and V3. Therefore, a withstand voltage of the transistors constituting the inverters INV11 to INV16 and the shift circuits LS1, LS2 can be lower than a difference between V1 and V3.

Figure 15:
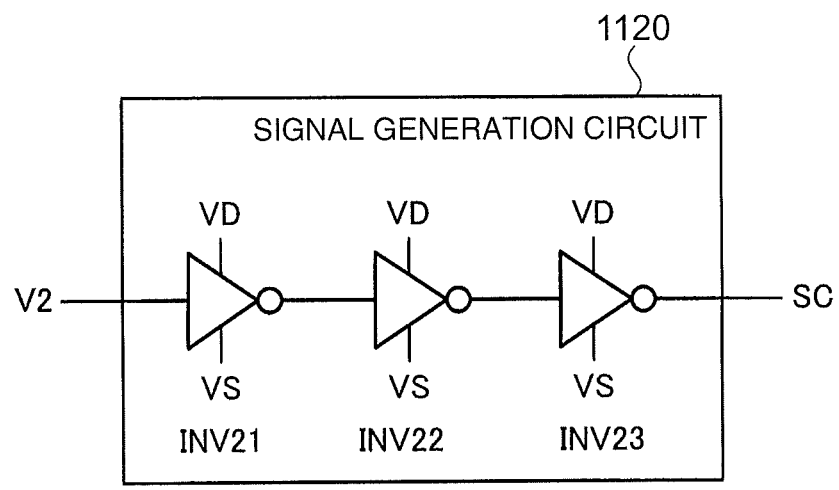
FIG. 15 shows an example of a configuration of a signal generation circuit.

FIG. 15 shows an example of a configuration of the signal generation circuit 1120 according to the present embodiment. The signal generation circuit 1120 includes inverters INV21, INV22, INV23. It should be noted that the signal generation circuit 1120 according to the present embodiment is not limited to the configuration of FIG. 15, and may be embodied with various modifications. For example, a part of constituent elements thereof may be omitted or replaced with other constituent elements, and other constituent elements may be added.

The first supply voltage VS serving as a low-potential power supply and the second supply voltage VD serving as a high-potential power supply are supplied to the inverters INV21, INV22, INV23. The second power supply voltage V2 is input to a gate of the inverter INV21.

When the voltage generation circuit 1110 is in the first state, the first power supply voltage V1 (for example, 0 V) is supplied as the first supply voltage VS, and the second power supply voltage V2 (for example, 5 V) is supplied as the second supply voltage VD. Therefore, the inverter INV21 outputs V1, the inverter INV22 outputs V2, and the inverter INV23 outputs V1.

When the voltage generation circuit 1110 is in the second state, the second power supply voltage V2 is supplied as the first supply voltage VS, and the third power supply voltage V3 (for example, 10 V) is supplied as the second supply voltage VD. Therefore, the inverter INV21 outputs V3, the inverter INV22 outputs V2, and the inverter INV23 outputs V3.

The first supply voltage VS may change in a range between the first power supply voltage V1 and the second power supply voltage V2. The second supply voltage VD may change in a range between a fourth power supply voltage V4 and the third power supply voltage V3. Note, the fourth power supply voltage V4 serves as a fourth voltage higher than the first power supply voltage V1, and the third power supply voltage V3 is higher than the fourth power supply voltage V4. That is to say, when the voltage generation circuit 1110 is in the first state, the first power supply voltage V1 may be supplied as the first supply voltage VS, and the fourth power supply voltage V4 may be supplied as the second supply voltage VD. When the voltage generation circuit 1110 is in the second state, the second power supply voltage V2 may be supplied as the first supply voltage VS, and the third power supply voltage V3 may be supplied as the second supply voltage VD. The second power supply voltage V2 or the fourth power supply voltage V4 may be input to the gate of the inverter INV21. The first to fourth power supply voltages V1 to V4 may respectively be 0 V, 6 V, 10 V and 4 V, or may respectively be 0 V, 4 V, 10 V and 6 V.

In this way, the signal generation circuit 1120 according to the present embodiment can change voltages output from the inverters without changing voltages input to the gates of the inverters. When the voltage generation circuit 1110 is in the first state, the voltage level of the first power supply voltage V1 can be output as the switch control signal SC. When the voltage generation circuit 1110 is in the second state, the voltage level of the third power supply voltage V3 can be output as the switch control signal SC.

While three inverters are used in the example of the configuration shown in FIG. 15, the number of the inverters is not limited in this way. It is sufficient to use any odd number of inverters. For example, the signal generation circuit 1120 may include one inverter.

As the power supply voltages supplied to the inverters INV21, INV22, INV23 are either V1 and V2 or V2 and V3, a withstand voltage of transistors constituting the inverters INV21, INV22, INV23 can be lower than the difference between V1 and V3.

As described above, the circuit device 1100 according to the present embodiment can not only control on and off of switch elements for switching between a positive driving signal and a negative driving signal, but also switch the potentials of P-type and N-type wells of transistors constituting the switch elements, without using transistors with a high withstand voltage. Here, transistors with a high withstand voltage denote, for example, transistors with a withstand voltage of 10 V or higher.

4. Other Source Drivers

Figure 16:
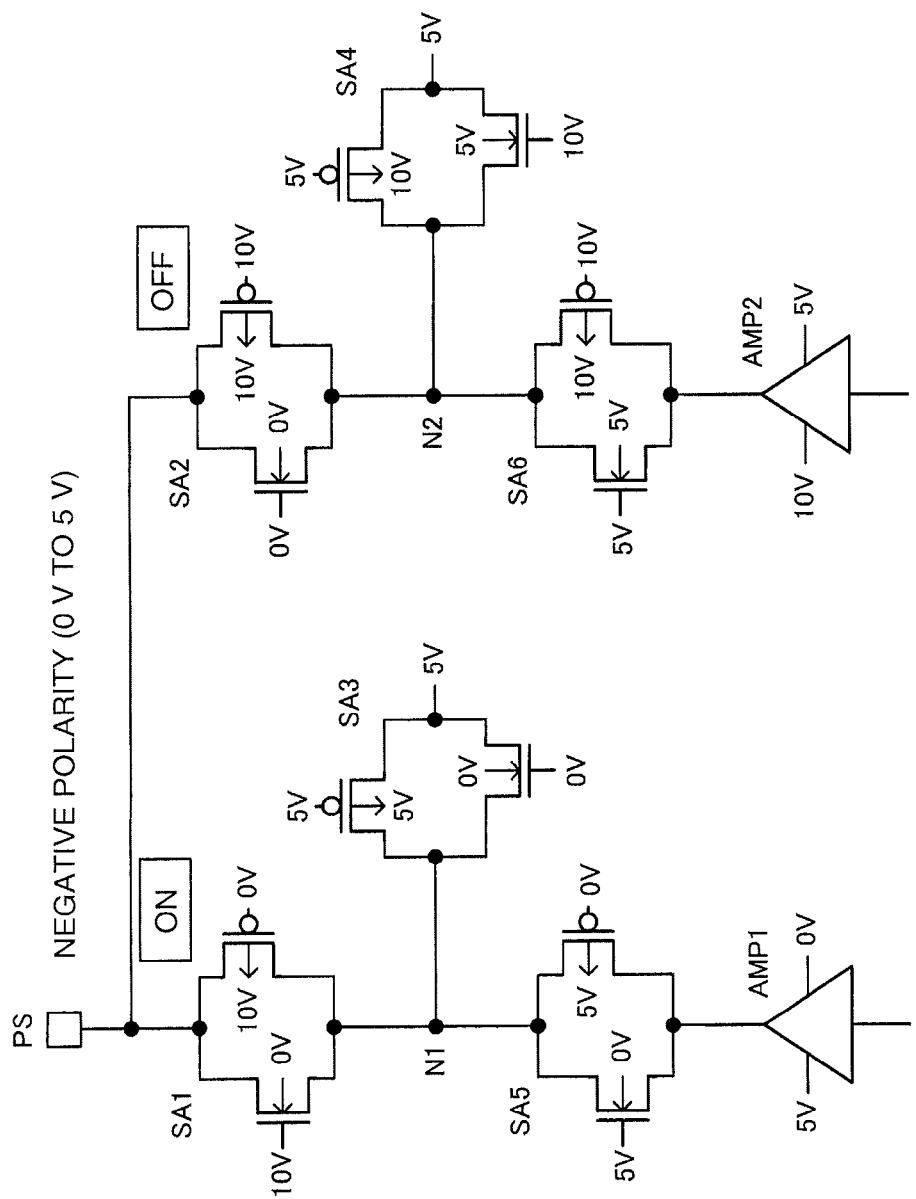
FIG. 16 shows an example of a configuration of a source driver according to a comparative example (for the case where a negative driving signal is output).

FIG. 16 shows an example of a source driver that does not use the circuit device 1100 according to the present embodiment as a comparative example. FIG. 16 depicts the case where a negative driving signal is output. The source driver according to the comparative example includes switch elements SA1 to SA6 and amplification circuits AMP1, AMP2. In the following description, it is assumed that a voltage (gradation voltage) of a negative driving signal is 0 V to 5 V, while a voltage (gradation voltage) of a positive driving signal is 5 V to 10 V.

The switch element SA1 is placed in an on state upon input of 10 V to a gate of an N-type transistor and input of 0 V to a gate of a P-type transistor. In this way, the negative driving signal from the amplification circuit AMP1 is output to a driving signal output terminal PS.

The switch element SA2 is placed in an off state upon input of 0 V to a gate of an N-type transistor and input of 10 V to a gate of a P-type transistor. In this way, the positive driving signal from the amplification circuit AMP2 is not output to the driving signal output terminal PS.

The switch element SA3 is placed in an off state upon input of 0 V to a gate of an N-type transistor and input of 5 V to a gate of a P-type transistor.

The switch element SA4 is placed in an on state upon input of 10 V to a gate of an N-type transistor and input of 5 V to a gate of a P-type transistor. In this way, the potential of a node N2 can be set at 5 V.

The switch element SA5 is placed in an on state upon input of 5 V to a gate of an N-type transistor and input of 0 V to a gate of a P-type transistor. In this way, the negative driving signal from the amplification circuit AMP1 is output to the switch element SA1.

The switch element SA6 is placed in an off state upon input of 5 V to a gate of an N-type transistor and input of 10 V to a gate of a P-type transistor. In this way, the positive driving signal from the amplification circuit AMP2 is not output to the switch element SA2.

Figure 17:
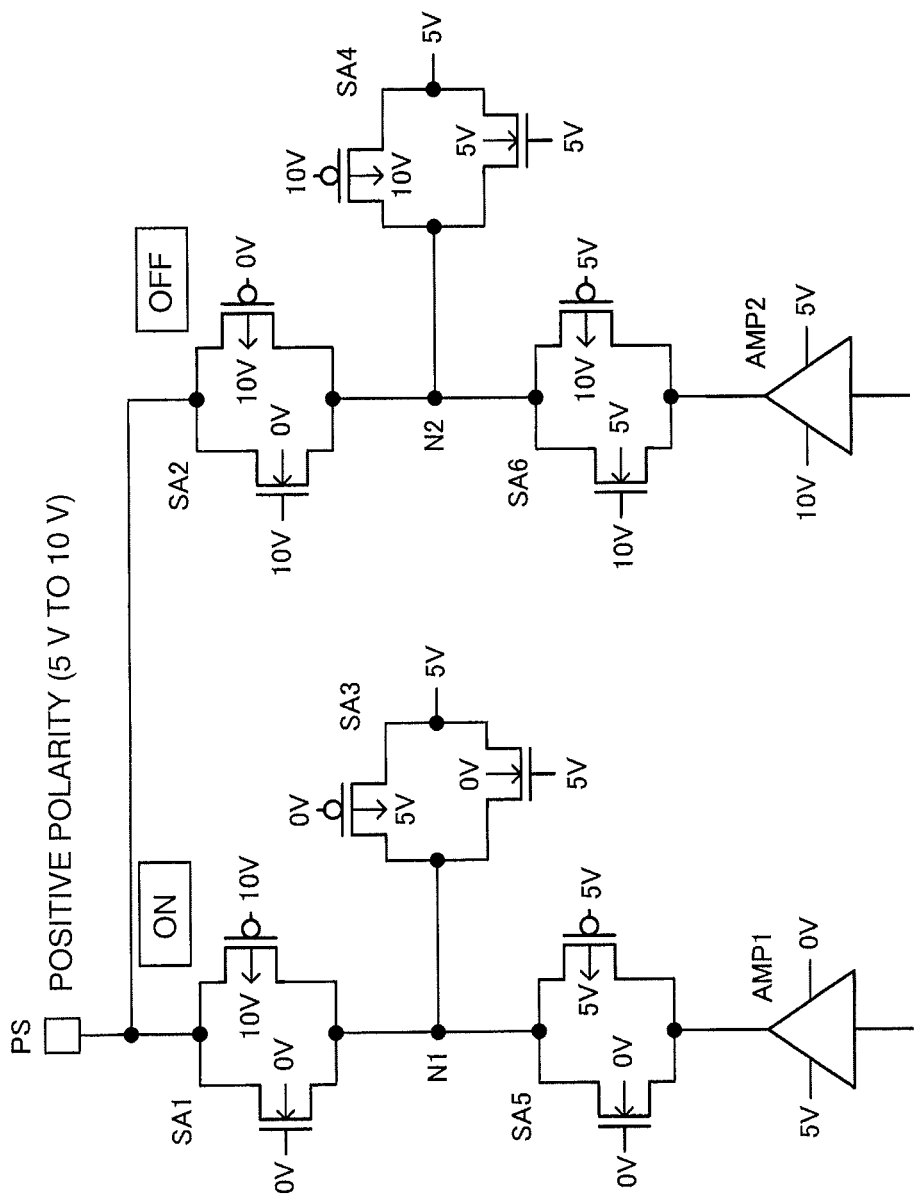
FIG. 17 shows an example of a configuration of a source driver according to a comparative example (for the case where a positive driving signal is output).

FIG. 17 depicts the case where the source driver according to the comparative example outputs a positive driving signal. The circuit configuration is the same as the one shown in FIG. 16.

The switch element SA1 is placed in an off state upon input of 0 V to the gate of the N-type transistor and input of 10 V to the gate of the P-type transistor. In this way, the negative driving signal from the amplification circuit AMP1 is not output to the driving signal output terminal PS.

The switch element SA2 is placed in an on state upon input of 10 V to the gate of the N-type transistor and input of 0 V to the gate of the P-type transistor. In this way, the positive driving signal from the amplification circuit AMP2 is output to the driving signal output terminal PS.

The switch element SA3 is placed in an on state upon input of 5 V to the gate of the N-type transistor and input of 0 V to the gate of the P-type transistor. In this way, the potential of a node N1 can be set at 5 V.

The switch element SA4 is placed in an off state upon input of 5 V to the gate of the N-type transistor and input of 10 V to the gate of the P-type transistor.

The switch element SA5 is placed in an off state upon input of 0 V to the gate of the N-type transistor and input of 5 V to the gate of the P-type transistor. In this way, the negative driving signal from the amplification circuit AMP1 is not output to the switch element SA1.

The switch element SA6 is placed in an on state upon input of 10 V to the gate of the N-type transistor and input of 5 V to the gate of the P-type transistor. In this way, the positive driving signal from the amplification circuit AMP2 is output to the switch element SA2.

As is apparent from FIGS. 16 and 17, a voltage of 10 V is applied to transistors constituting the switch elements SA1, SA2. Therefore, it is necessary to use transistors with a high withstand voltage (for example, a withstand voltage of 10 V or higher) as the transistors constituting the switch elements SA1, SA2. Transistors with a high withstand voltage have a larger element size than transistors with an intermediate withstand voltage (for example, a withstand voltage of approximately 6 V), and therefore contribute to an increase in an area occupied by circuits.

Figure 18:
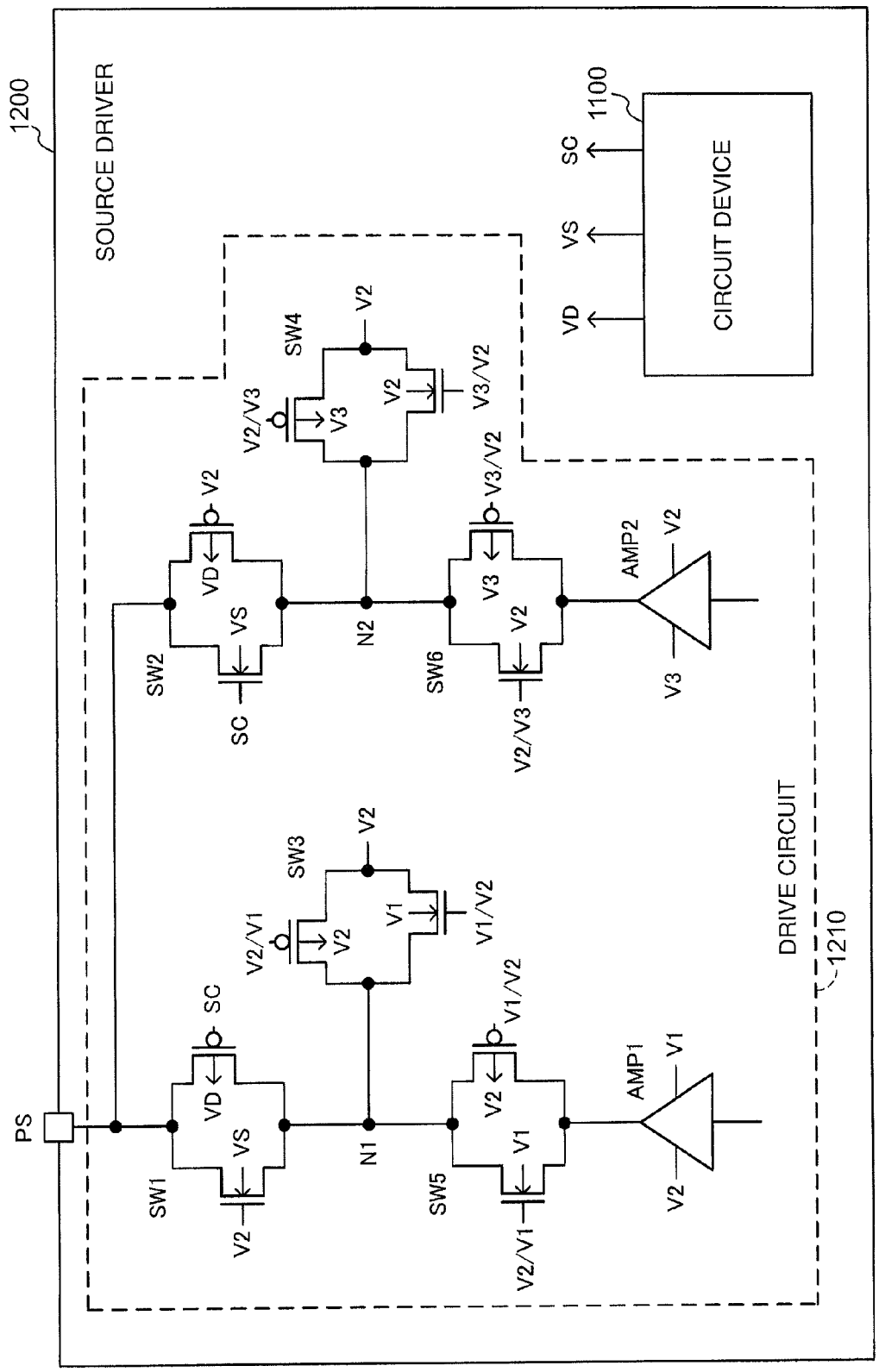
FIG. 18 shows a first configuration example of a source driver.

FIG. 18 shows a first configuration example of another source driver 1200 according to the present embodiment. The source driver 1200 according to the first configuration example includes a circuit device 1100, a driving signal output terminal PS and a drive circuit 1210. It should be noted that the source driver 1200 according to the present embodiment is not limited to the configuration of FIG. 18, and may be embodied with various modifications. For example, a part of constituent elements thereof may be omitted or replaced with other constituent elements, and other constituent elements may be added. The source driver 1200 may, for example, further include a D/A conversion circuit, a gradation voltage generation circuit, and the like not shown in the drawings.

The circuit device 1100 has already been described with reference to FIGS. 12 to 15, and therefore a detailed description thereof is omitted here.

The driving signal output terminal PS is electrically connected to a source line of an electrooptical panel. A driving signal output from the drive circuit 1210 is output to the source line via the driving signal output terminal PS.

The drive circuit 1210 includes switch elements SW1 to SW6, a first amplification circuit AMP1, and a second amplification circuit AMP2.

One end of the first switch element SW1 and one end of the second switch element SW2 are mutually connected to the driving signal output terminal PS. The first switch element SW1 and the second switch element SW2 are switched on and off based on the switch control signal SC output from the signal generation circuit 1120. More specifically, in a negative polarity period (broadly speaking, a first period) for outputting a negative driving signals to a source line, the first switch element SW1 is switched on. In a positive polarity period (broadly speaking, a second period) for outputting a positive driving signal to the source line, the second switch element SW2 is switched on.

The first supply voltage VS is supplied to a P-type well of transistors constituting the first switch element SW1 and the second switch element SW2. The second supply voltage VD is supplied to an N-type well of such transistors.

The first amplification circuit AMP1 outputs a negative driving signal to the other end of the first switch element SW1. The second amplification circuit AMP2 outputs a positive driving signal to the other end of the second switch element SW2.

The operations of the switch elements SW3 to SW6 are the same as the operations of the switch elements SA3 to SA6 shown in FIGS. 16 and 17, and therefore a detailed description thereof is omitted here.

Figure 19A:
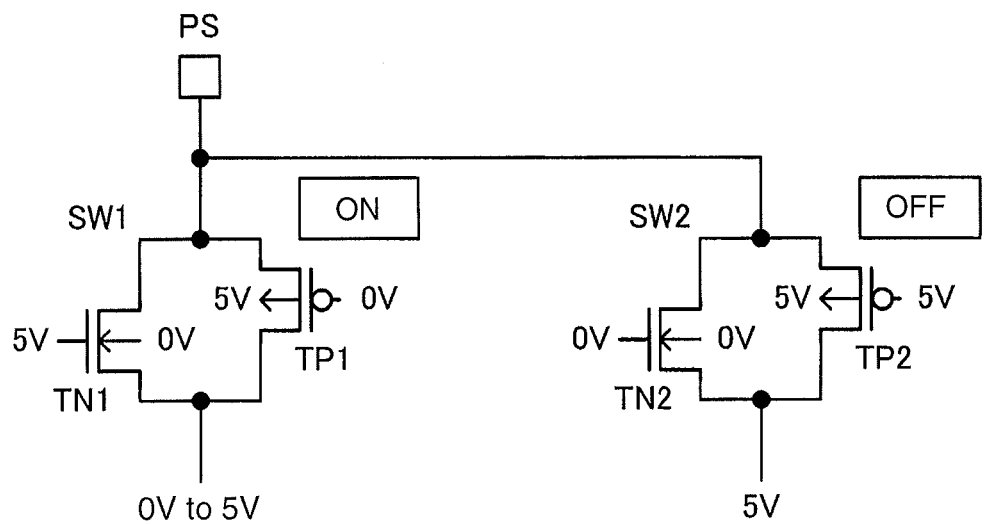
FIGS. 19A and 19B are diagrams for describing the operations of switch elements.
Figure 19B:
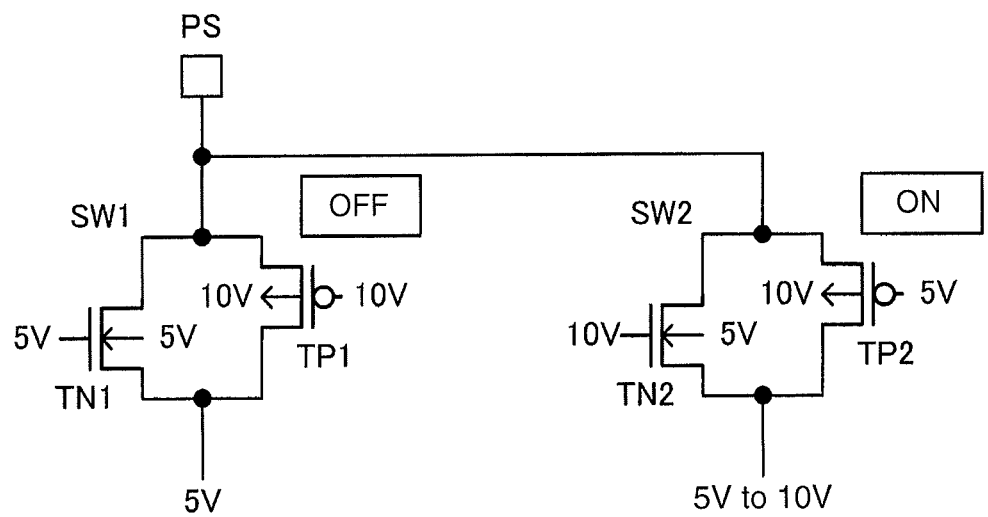

FIGS. 19A and 19B are diagrams for describing the operations of the switch elements SW1, SW2. In a negative polarity period shown in FIG. 19A, the voltage generation circuit 1110 (well potential generation circuit) is placed in the first state based on the state switching signal (polarity switching signal) POL. The voltage generation circuit 1110 outputs the voltage level of the first power supply voltage V1 (for example, 0 V) as the first supply voltage VS, and outputs the voltage level of the second power supply voltage V2 (for example, 5 V) as the second supply voltage VD. The signal generation circuit 1120 also outputs the voltage level of the first power supply voltage V1 (for example, 0 V) as the switch control signal SC.

In this way, the potential of a P-type well in N-type transistors TN1, TN2 of the switch elements SW1, SW2 is set at V1 (0 V), while the potential of an N-type well in P-type transistors TP1, TP2 of the switch elements SW1, SW2 is set at V2 (5 V). Furthermore, in the switch element SW1, V2 (5 V) and V1 (0 V) are input to gates of the N-type transistor TN1 and the P-type transistor TP1, respectively. Therefore, the switch element SW1 is switched on. On the other hand, in the switch element SW2, V1 (0 V) and V2 (5 V) are input to gates of the N-type transistor TN2 and the P-type transistor TP2, respectively. Therefore, the switch element SW2 is switched off.

In a positive polarity period shown in FIG. 19B, the voltage generation circuit 1110 (well potential generation circuit) is placed in the second state based on the state switching signal (polarity switching signal) POL. The voltage generation circuit 1110 outputs the voltage level of the second power supply voltage V2 (for example, 5 V) as the first supply voltage VS, and outputs the voltage level of the third power supply voltage V3 (for example, 10 V) as the second supply voltage VD. The signal generation circuit 1120 also outputs the voltage level of the third power supply voltage V3 (for example, 10 V) as the switch control signal SC.

In this way, the potential of the P-type well in the N-type transistors TN1, TN2 of the switch elements SW1, SW2 is set at V2 (5 V), while the potential of the N-type well in the P-type transistors TP1, TP2 of the switch elements SW1, SW2 is set at V3 (10 V). In the switch element SW1, V2 (5 V) and V3 (10 V) are input to the gates of the N-type transistor TN1 and the P-type transistor TP1, respectively. Therefore, the switch element SW1 is switched off. On the other hand, in the switch element SW2, V3 (10 V) and V2 (5 V) are input to the gates of the N-type transistor TN2 and the P-type transistor TP2, respectively. Therefore, the switch element SW2 is switched on.

In the source driver 1200 according to the present embodiment, a voltage equal to a difference between V1 and V2 or a difference between V2 and V3 is applied to the transistors constituting the switch elements SW1, SW2, but a voltage equal to a difference between V1 and V3 is not applied thereto. Therefore, a withstand voltage of the transistors constituting the switch elements SW1, SW2 can be lower than the voltage equal to the difference between V1 and V3. Furthermore, the voltage equal to the difference between V1 and V3 is not applied to transistors constituting the switch elements SW3 to SW6 and the amplification circuits AMP1, AMP2, either. Therefore, a withstand voltage of these transistors can also be lower than the voltage equal to the difference between V1 and V3.

As described above, the source driver 1200 according to the present embodiment can be configured without using transistors with a high withstand voltage. This can reduce an area occupied by circuits and the number of steps in a manufacturing process. As a result, for example, the manufacturing cost can be reduced.

Figure 20:
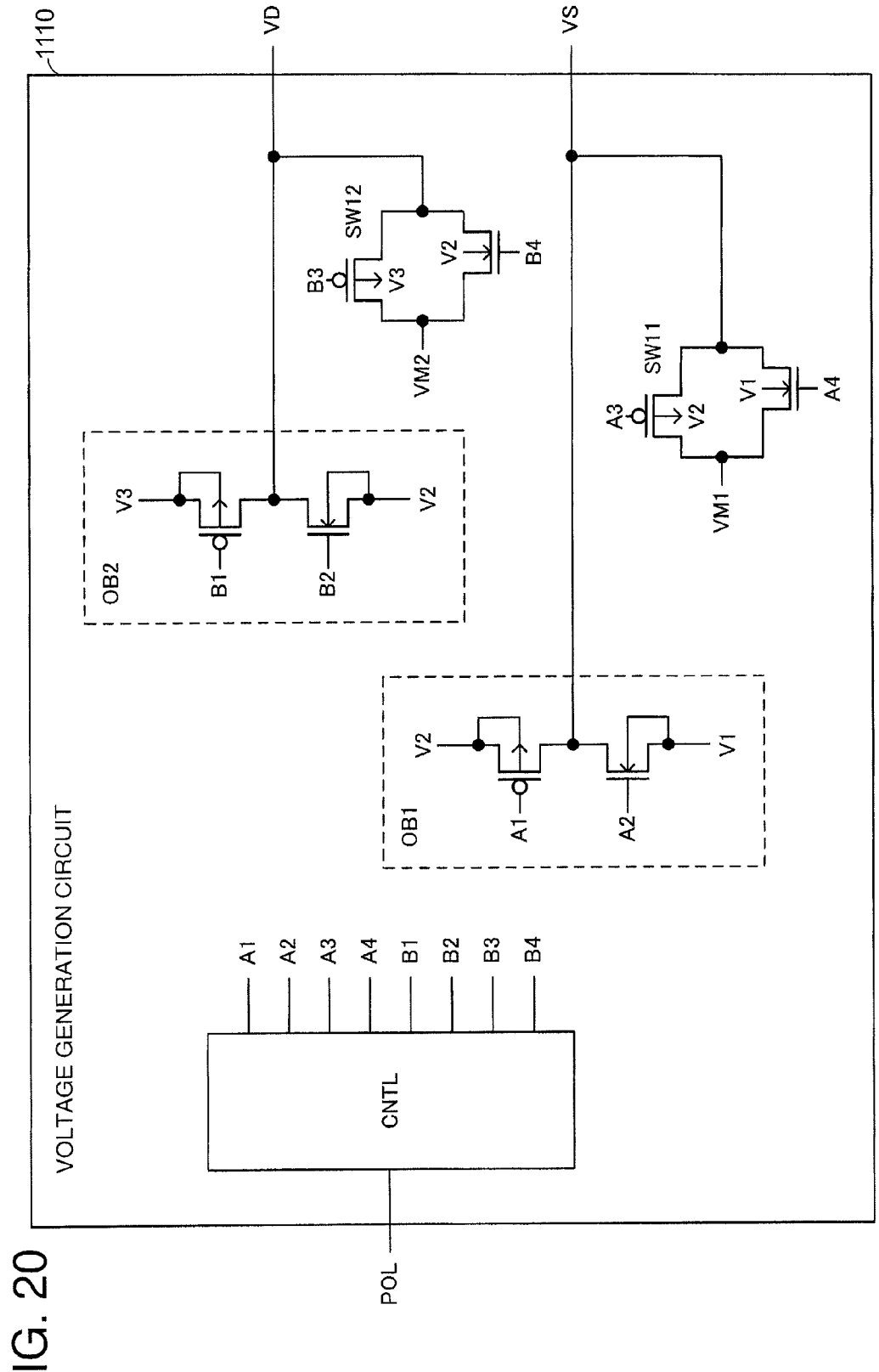
FIG. 20 shows a second configuration example of the voltage generation circuit.

FIG. 20 shows a second configuration example of the voltage generation circuit 1110 according to the present embodiment. The voltage generation circuit 1110 according to the second configuration example includes a first output circuit OB1, a second output circuit OB2, switch elements SW11, SW12, and a control circuit CNTL. It should be noted that the voltage generation circuit 1110 according to the present embodiment is not limited to the configuration of FIG. 20, and may be embodied with various modifications. For example, a part of constituent elements thereof may be omitted or replaced with other constituent elements, and other constituent elements may be added.

The first output circuit OB1 is realized by adding a function of setting an output node at high impedance to the inverter INV1 according to the first configuration example (FIG. 13). The first output circuit OB1 outputs the voltage level of the first power supply voltage V1 or the voltage level of the second power supply voltage V2, or sets the output node at high impedance, based on control signals A1, A2.

Similarly, the second output circuit OB2 is realized by adding a function of setting an output node at high impedance to the inverter INV2 according to the first configuration example (FIG. 13). The second output circuit OB2 outputs the voltage level of the second power supply voltage V2 or the voltage level of the third power supply voltage V3, or sets the output node at high impedance, based on control signals B1, B2.

Control signals A3, A4 control on and off of the output of the first intermediate voltage VM1 from the switch element SW11. Similarly, control signals B3, B4 control on and off of the output of the second intermediate voltage VM2 from the switch element SW12.

The control circuit CNTL generates and outputs the control signals A1 to A4, B1 to B4 based on the state switching signal POL. The control circuit CNTL can be realized by, for example, the level shifter LVST and a CMOS logic circuit shown in FIG. 14.

When switching from the first state to the second state and from the second state to the first state, the voltage generation circuit 1110 according to the second configuration example can output the first intermediate voltage VM1 and the second intermediate voltage VM2 as the first supply voltage VS and the second supply voltage VD, respectively. Here, the first intermediate voltage VM1 is an intermediate voltage between the first power supply voltage V1 and the second power supply voltage V2, and the second intermediate voltage VM2 is an intermediate voltage between the second power supply voltage V2 and the third power supply voltage V3.

This can prevent transistors constituting the switch elements SW1, SW2 from temporarily receiving a voltage that exceeds a withstand voltage thereof when, for example, a timing for switching the potential of a P-type well from V1 to V2 does not coincide with a timing for switching the potential of an N-type well from V2 to V2.

Figure 21:
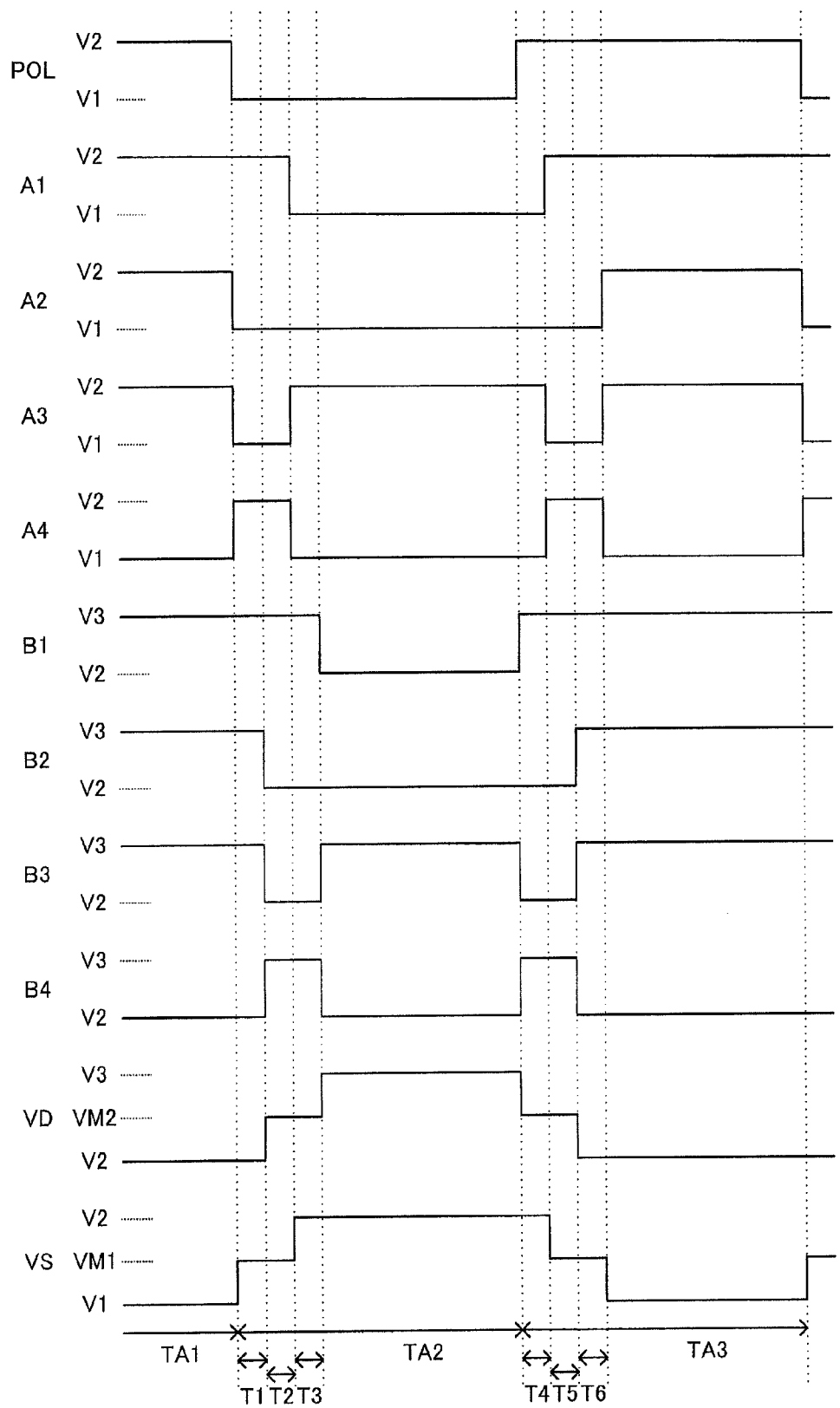
FIG. 21 shows examples of signal waveforms of the voltage generation circuit according to the second configuration example.

FIG. 21 shows examples of signal waveforms of the voltage generation circuit 1110 according to the second configuration example. More specifically, FIG. 21 shows waveforms of the state switching signal POL, the control signals A1 to A4, B1 to B4, the first supply voltage VS, and the second supply voltage VD.

When the state switching signal POL changes from V2 to V1, a negative polarity period TA1 switches to a positive polarity period TA2. This timing of switching is followed by periods T1, T2, T3 in this order.

In period T1, the control signal A1 and the control signal A2 are set at V2 and V1, respectively, and therefore an output node of the output circuit OB1 is set at high impedance. Also, the control signal A3 and the control signal A4 are set at V1 and V2, respectively, and therefore the switch element SW11 is switched on. Consequently, the first supply voltage VS is set at the intermediate voltage VM1. On the other hand, the control signal B1 and the control signal B2 are both set at V3, and therefore the output circuit OB2 outputs V2. Also, the control signal B3 and the control signal B4 are set at V3 and V2, respectively, and therefore the switch element SW12 is switched off. Consequently, the second supply voltage VD is set at V2.

In period T2, the control signal A1 and the control signal A2 are set at V2 and V1, respectively, and therefore the output node of the output circuit OB1 is set at high impedance. Also, the control signal A3 and the control signal A4 are set at V1 and V2, respectively, and therefore the switch element SW11 is switched on. Consequently, the first supply voltage VS is set at the intermediate voltage VM1. On the other hand, the control signal B1 and the control signal B2 are set at V3 and V2, respectively, and therefore an output node of the output circuit OB2 is set at high impedance. Also, the control signal B3 and the control signal B4 are set at V2 and V3, respectively, and therefore the switch element SW12 is switched on. Consequently, the second supply voltage VD is set at VM2.

In period T3, the control signal A1 and the control signal A2 are both set at V1, and therefore the output circuit OB1 outputs V2. Also, the control signal A3 and the control signal A4 are set at V2 and V1, respectively, and therefore the switch element SW11 is switched off. Consequently, the first supply voltage VS is set at V2. On the other hand, the control signal B1 and the control signal B2 are set at V3 and V2, respectively, and therefore the output node of the output circuit OB2 is set at high impedance. Also, the control signal B3 and the control signal B4 are set at V2 and V3, respectively, and therefore the switch element SW12 is switched on. Consequently, the second supply voltage VD is set at VM2.

Similarly, the timing at which the positive polarity period TA2 switches to a negative polarity period TA3 is followed by periods T4, T5, T6 in this order. In period T4, the first supply voltage VS and the second supply voltage VD are set at V2 and VM2, respectively. In period T5, the first supply voltage VS and the second supply voltage VD are set at VM1 and VM2, respectively. In period T6, the first supply voltage VS and the second supply voltage VD are set at VM1 and V2, respectively.

In this way, the voltage generation circuit 1110 according to the second configuration example enables VS and VD to change gradually. This can prevent a voltage difference between VS and VD from exceeding a withstand voltage of transistors due to incoincidence of the timings for switching well potentials.

Figure 22:
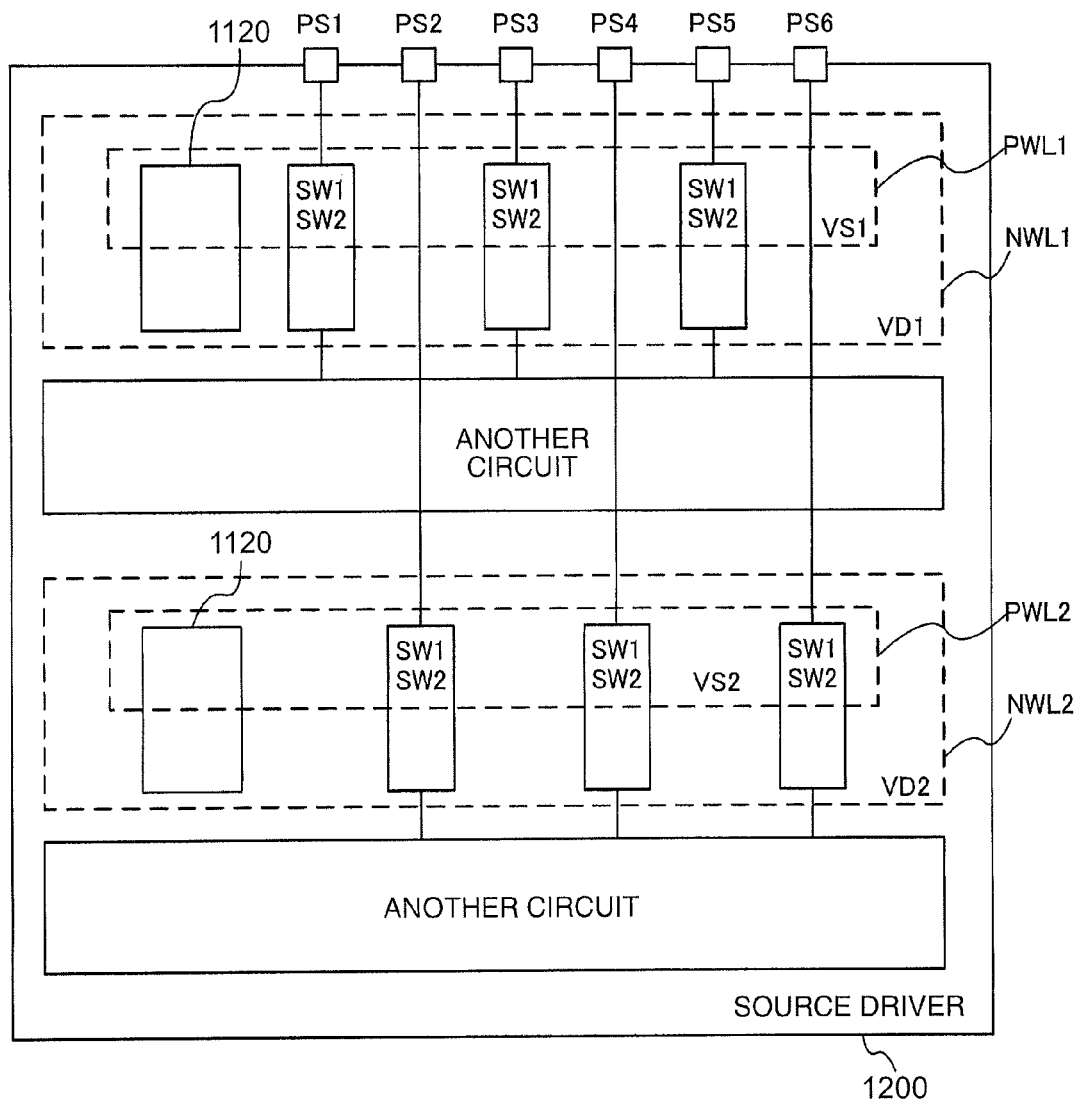
FIG. 22 shows an example of a layout of a source driver.

FIG. 22 shows an example of a layout of the source driver 1200 according to the present embodiment. The source driver 1200 shown in FIG. 22 includes driving signal output terminals PS1 to PS6. Neighboring terminals output driving signals of opposite polarities. For example, in a period in which the driving signal output terminals PS1, PS3, PS5 output negative driving signals, the driving signal output terminals PS2, PS4, PS6 output positive driving signals.

Transistors constituting the first switch element SW1, the second switch element SW2 and the signal generation circuit 1120 share a mutual P-type well PWL1 (PWL2). The transistors constituting the first switch element SW1, the second switch element SW2 and the signal generation circuit 1120 also share a mutual N-type well NWL1 (NWL2).

More specifically, as shown in FIG. 22, the transistors constituting the switch elements SW1, SW2 connected to the driving signal output terminals PS1, PS3, PS5 and the signal generation circuit 1120 for controlling on and off of these switch elements are formed on the P-type well PWL1 and the N-type well NWL1. A supply voltage VS1 and a supply voltage VD1 are supplied to the P-type well PWL1 and the N-type well NWL1, respectively.

On the other hand, the transistors constituting the switch elements SW1, SW2 connected to the driving signal output terminals PS2, PS4, PS6 and the signal generation circuit 1120 for controlling on and off of these switch elements are formed on the P-type well PWL2 and the N-type well NWL2. A supply voltage VS2 and a supply voltage VD2 are supplied to the P-type well PWL2 and the N-type well NWL2, respectively.

An efficient layout can be achieved by thus configuring the switch elements SW1, SW2 outputting driving signals of the same polarity and the corresponding signal generation circuit 1120 to share a mutual P-type well and a mutual N-type well.

Figure 23:
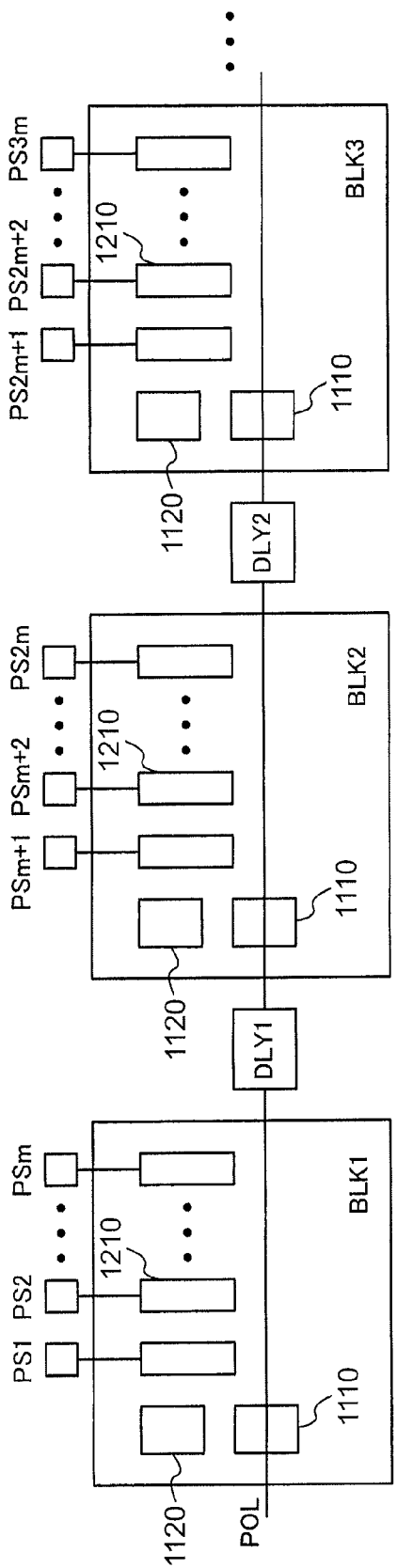
FIG. 23 shows a second configuration example of a source driver.

FIG. 23 shows a second configuration example of another source driver 1200 according to the present embodiment. The source driver 1200 according to the second configuration example includes first to $n^{th}$ drive circuit blocks BLK1 to BLKn (n is an integer equal to or greater than two). It should be noted that the source driver 1200 according to the present embodiment is not limited to the configuration of FIG. 23, and may be embodied with various modifications. For example, apart of constituent elements thereof may be omitted or replaced with other constituent elements, and other constituent elements may be added.

Each of the first to $n^{th}$ drive circuit blocks BLK1 to BLKn includes a plurality of drive circuits 1210, a voltage generation circuit 1110 and a signal generation circuit 1120.

For example, as shown in FIG. 23, the first drive circuit block BLK1 includes m drive circuits 1210, the voltage generation circuit 1110 and the signal generation circuit 1120 (m is an integer equal to or greater than two). The m drive circuits 1210 output driving signals to the driving signal output terminals PS1 to PSm. The voltage generation circuit 1110 outputs the first supply voltage VS and the second supply voltage VD respectively to a P-type well and an N-type well included in the first drive circuit block BLK1. The signal generation circuit 1120 outputs switch control signals SC to switch elements SW1, SW2 included in the first drive circuit block BLK1. The same goes for other drive circuit blocks BLK2 to BLKn. By thus dividing the P-type well and the N-type well into a plurality of blocks, a well potential can be set for each block. This can prevent well potentials of a plurality of wells from changing simultaneously, and hence suppress the occurrence of a latchup.

The source driver 1200 according to the second configuration example may further include delay circuits DLY1 to DLYn−1. The delay circuits DLY1 to DLYn−1 delay the state switching signal POL (polarity switching signal). For example, as shown in FIG. 23, the first delay circuit DLY1 is provided between the voltage generation circuit 1110 of the first drive circuit block BLK1 and the voltage generation circuit 1110 of the second drive circuit block BLK2, and delays the polarity switching signal POL. The first delay circuit DLY1 outputs the delayed polarity switching signal POL to the voltage generation circuit 1110 of the second drive circuit block BLK2 and to the second delay circuit DLY2.

In this way, when the voltage generation circuits 1110 of the first to the $n^{th}$ drive circuit blocks BLK1 to BLKn switch from the first state to the second state or from the second state to the first state, the switching of the voltage generation circuit 1110 of the $(j+1)^{th}$ drive circuit block BLKj+1 can be delayed from the switching of the voltage generation circuit 1110 of the $j^{th}$ drive circuit block BLKj by a predetermined period (j is an integer satisfying the relationship 1≤j≤n−1). For example, the voltage generation circuit 1110 of the second drive circuit block BLK2 switches from one state to another a predetermined period after the voltage generation circuit 1110 of the first drive circuit block BLK1 switches from one state to another. Likewise, the voltage generation circuit 1110 of the third drive circuit block BLK3 switches from one state to another a predetermined period after the voltage generation circuit 1110 of the second drive circuit block BLK2 switches from one state to another. Note that the predetermined period denotes, for example, a delay period of the delay circuits DLY1 to DLYn−1.

By thus providing the delay circuits DLY1 to DLYn−1, a time difference can be set between the timings for switching the well potentials of the blocks. This can prevent well potentials of a plurality of wells from changing simultaneously, and hence suppress, for example, the occurrence of a latchup.

As described above, with the circuit device 1100 and the source driver 1200 according to the present embodiment, a source driver that performs dot inversion driving can be realized without using transistors with a high withstand voltage. This can reduce an area occupied by circuits and the number of steps in a manufacturing process. As a result, for example, the manufacturing cost can be reduced. Furthermore, when switching a well potential, the well potential can be gradually changed. This can prevent a voltage applied to switch elements that switch the polarity of a driving signal from temporarily exceeding the withstand voltage of the transistors. Moreover, a P-type well and an N-type well can be divided into a plurality of blocks, and a time difference can be set between the timings for switching the well potentials of the blocks. This can, for example, suppress the occurrence of a latchup.

5. Electrooptical Device

Figure 24:
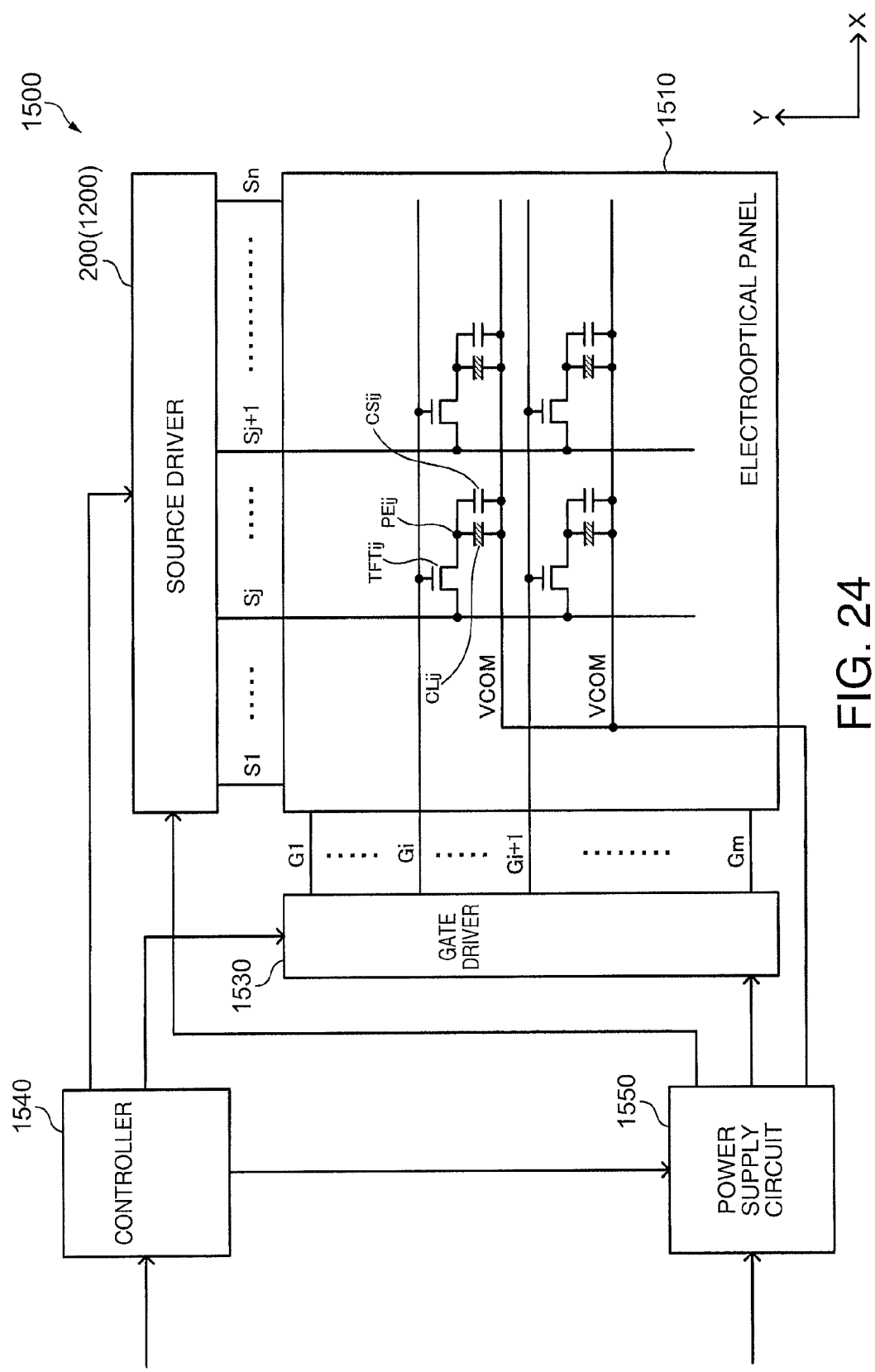
FIG. 24 shows an example of a fundamental configuration of an electrooptical device.

FIG. 24 shows an example of a fundamental configuration of an electrooptical device 1500 including a source driver 200 according to the present embodiment. The electrooptical device 1500 includes an electrooptical panel 1510 (for example, an LCD (liquid crystal display) panel), a source driver 200, a gate driver 1530, a controller 1540, and a power supply circuit 1550. It should be noted that the electrooptical device 1500 need not include all of the above-referenced circuit blocks. A part of the above-referenced circuit blocks may be omitted from the configuration of the electrooptical device 1500. The source driver 1200 may be used as the source driver 200.

The electrooptical panel 1510 includes a plurality of gate lines G1 to Gm, a plurality of source lines S1 to Sn, and pixel electrodes identified by the gate lines G1 to Gm and the source lines S1 to Sn (m and n are each an integer equal to or greater than two). In this case, an active-matrix liquid crystal device can be configured by connecting TFTs (thin-film transistors, or broadly speaking, switching elements) to the source lines, and by connecting the pixel electrodes to the TFTs.

A gate electrode, a source electrode and a drain electrode of TFTij are connected to the gate line Gi, the source line Sj and the pixel electrode PEij, respectively. A liquid crystal capacitance CLij (liquid crystal element) and an auxiliary capacitance CSij are formed between the pixel electrode PEij and an opposing electrode VCOM (common electrode) that opposes the pixel electrode PEij via a liquid crystal element (broadly speaking, electrooptical material). Liquid crystals are enclosed between an active-matrix substrate and an opposing substrate. The TFTij, the pixel electrode PEij and the like are formed on the active-matrix substrate. The opposing electrode VCOM is formed on the opposing substrate. The pixel transmittance changes in accordance with a voltage applied between the pixel electrode PEij and the opposing electrode VCOM.

Note that the voltage applied to the opposing electrode VCOM is generated by the power supply circuit 1550. Opposing electrodes VCOM need not be formed across the entire surface of the opposing substrate, and may be formed in strips in correspondence with the gate lines.

The source driver 200 according to the present embodiment (FIG. 6) is used as a circuit for driving the source lines. The source driver 200 drives the source lines S1 to Sn of the electrooptical panel 1510 based on image data. On the other hand, the gate driver 1530 sequentially drives the gate lines G1 to Gm of the electrooptical panel 1510 for scanning.

The controller 1540 controls the source driver 200, the gate driver 1530 and the power supply circuit 1550 in accordance with the contents of settings configured by a host of, for example, a CPU (central processing unit) not shown in the drawings.

More specifically, for example, the controller 1540 sets operation modes for the source driver 200 and the gate driver 1530, and supplies internally-generated vertical synchronization signals and horizontal synchronization signals to the source driver 200 and the gate driver 1530. The controller 1540 also controls timings for inverting the polarity of a voltage of the opposing electrodes VCOM for the power supply circuit 1550.

The power supply circuit 1550 generates various types of voltages (gradation voltages) necessary for driving the electrooptical panel 1510 and the voltage of the opposing electrodes VCOM based on a reference voltage supplied from the outside.

While the electrooptical device 1500 includes the controller 1540 in FIG. 24, the controller 1540 may be provided outside the electrooptical device 1500. Alternatively, the host may be included in the electrooptical device 1500 together with the controller 1540. Alternatively, a part or all of the source driver 200, the gate driver 1530, the controller 1540 and the power supply circuit 1550 may be formed in the electrooptical panel 1510.

It should be noted that the electrooptical panel 1510 is not limited to a liquid crystal panel, and may be, for example, a panel with organic or inorganic EL (electro luminescence) light-emitting elements.

Furthermore, it is more preferable to use the source driver 1200 including the circuit device 1100 according to the embodiment (FIG. 18 or 23) as a source driver of the electrooptical device 1500 than to use the source drivers according to the comparative examples. This is because the source driver 1200 allows circuits to be configured without using transistors with a high withstand voltage.

6. Electronic Device

Figure 25:
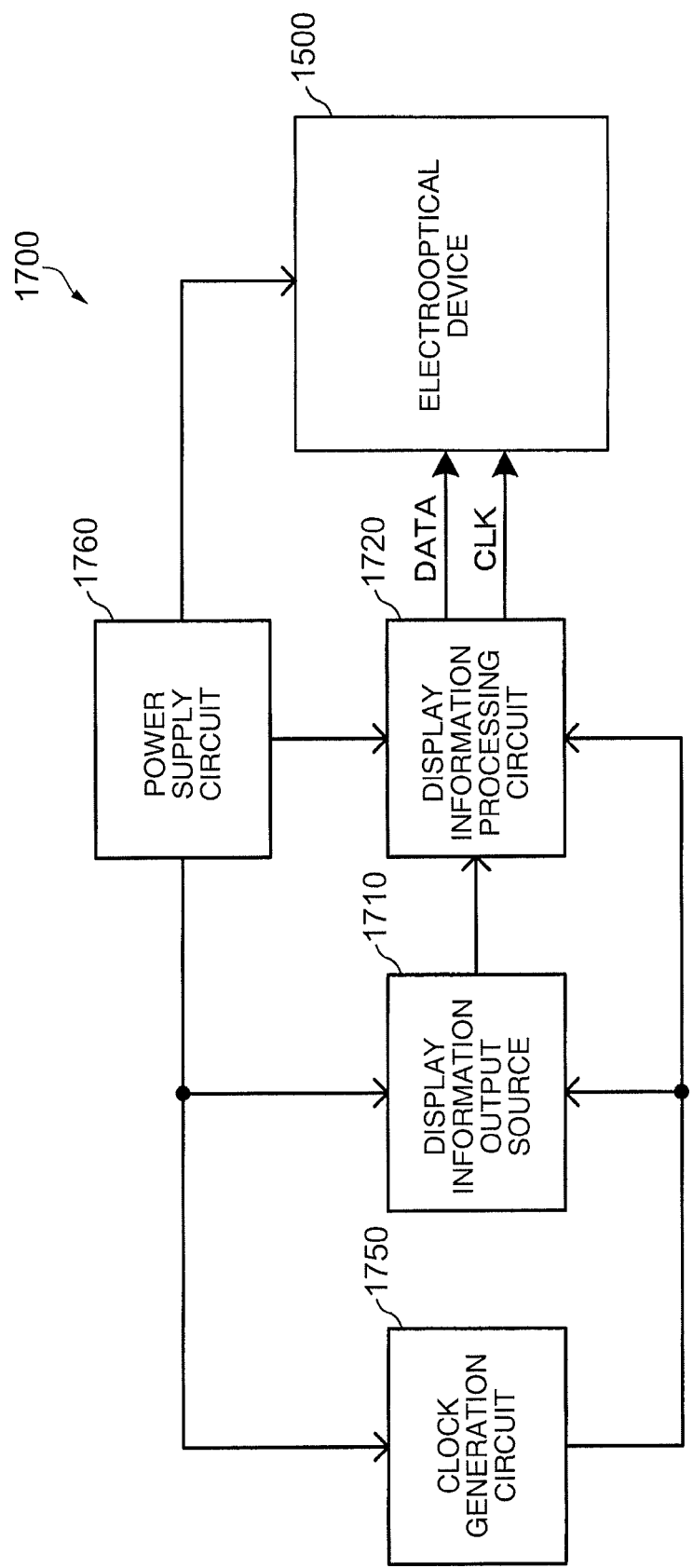
FIG. 25 shows an example of a fundamental configuration of an electronic device.

FIG. 25 shows an example of a fundamental configuration of an electronic device including the electrooptical device 1500 according to the present embodiment. In FIG. 25, the electronic device is depicted as a projection display device 1700.

The projection display device 1700 includes an electrooptical device 1500, a display information output source 1710, a display information processing circuit 1720, a clock generation circuit 1750, and a power supply circuit 1760. The display information output source 1710 includes, for example, a memory such as a ROM (read-only memory), a RAM (random-access memory) and an optical disc device, and a tuned circuit that outputs image signals in a tuned state. The display information output source 1710 outputs display information, such as image signals in a predetermined format, to the display information processing circuit 1720 based on clock signals from the clock generation circuit 1750. The display information processing circuit 1720 may include, for example, an amplification/polarity inversion circuit, a phase development circuit, a rotation circuit, a gamma correction circuit, or a clamp circuit. The power supply circuit 1760 supplies power to the above-referenced circuits.

While the present embodiment has been described above in detail, a person skilled in the art should easily understand that many modifications are possible without substantially departing from new matters and effects of the invention. Therefore, all examples of such modifications are to be embraced within the scope of the invention. For example, terms that are used at least once in the description or the drawings in conjunction with different terms having broader or similar meanings can be replaced with the different terms in any portion of the description or the drawings. Furthermore, the configurations and operations of the amplification circuit, the source driver, the electrooptical device, and the electronic device are not limited to those described in the present embodiment. They can be implemented with various modifications.

What is claimed is:

1. An amplification circuit comprising:
   an operational amplifier with a first input terminal connected to a reference node;
   a first capacitor provided between a first node and the reference node;
   a second capacitor provided between a second node and the reference node;
   a first switch element provided between the first node and an input node of an input voltage;
   a second switch element provided between the first node and a supply node of a first analog reference voltage;
   a third switch element provided between the second node and an output node of an output voltage;
   a fourth switch element provided between the second node and a supply node of a second analog reference voltage; and
   a fifth switch element provided between the output node of the output voltage and the reference node, wherein
   the input voltage changes in a range between a first voltage and a second voltage,
   the second voltage and a third voltage are supplied to the operational amplifier as a first power supply voltage and a second power supply voltage, respectively,
   the first analog reference voltage is a direct-current voltage between the first voltage and the second voltage,
   the second analog reference voltage is a direct-current voltage between the second voltage and the third voltage, and
   the first voltage, the second voltage and the third voltage are different from one another, and the second voltage is a voltage between the first voltage and the third voltage.

2. The amplification circuit according to claim 1, wherein
   in an initialization period, the second switch element, the fourth switch element and the fifth switch element are switched on, and
   in an output period for outputting the output voltage, the first switch element and the third switch element are switched on.

3. The amplification circuit according to claim 1, wherein
   a second input terminal of the operational amplifier is connected to a supply node of the second analog reference voltage.

4. The amplification circuit according to claim 1, wherein
   a withstand voltage of the first capacitor is higher than a difference between the second voltage and the third voltage.

5. The amplification circuit according to claim 1, wherein
   the first capacitor is a metal-insulator-metal capacitor.

6. The amplification circuit according to claim 1, wherein
   the output voltage is given by $VQ=VN-(C1/C2)\times(VIN-VP)$, where a capacitance of the first capacitor is $C1$, a capacitance of the second capacitor is $C2$, the input voltage is $VIN$, the first analog reference voltage is $VP$, the second analog reference voltage is $VN$, and the output voltage is $VQ$.

7. The amplification circuit according to claim 1, wherein
   a withstand voltage of transistors constituting the first to the fifth switch elements and the operational amplifier is lower than a difference between the first voltage and the third voltage and is higher than a difference between the second voltage and the third voltage.

8. A source driver that drives source lines of an electrooptical panel, comprising
   the amplification circuit according to claim 1.

9. The source driver according to claim 8, further comprising
   a second amplification circuit, wherein
   the first voltage and the second voltage are supplied to the second amplification circuit as the first power supply voltage and the second power supply voltage, respectively.

10. The source driver according to claim 9, further comprising:
    a D/A conversion circuit that receives gradation data and a plurality of reference voltages, selects one of the plurality of reference voltages that corresponds to the gradation data, and outputs the selected reference voltage to the amplification circuit and to the second amplification circuit; and
    a reference voltage generation circuit that generates the plurality of reference voltages and outputs the plurality of reference voltages to the D/A conversion circuit, wherein
    in a first period for outputting a negative driving voltage to the source lines, the amplification circuit outputs the negative driving voltage to the source lines, and
    in a second period for outputting a positive driving voltage to the source lines, the second amplification circuit outputs the positive driving voltage to the source lines.

11. The source driver according to claim 10, wherein
    the second amplification circuit includes:
    a second operational amplifier with a first input terminal connected to a second reference node;
    a third capacitor provided between a third node and the second reference node;
    a fourth capacitor provided between a fourth node and the second reference node;
    a sixth switch element provided between the third node and an input node of the input voltage;
    a seventh switch element provided between the third node and a supply node of the first analog reference voltage;
    an eighth switch element provided between the fourth node and an output node of a second output voltage;
    a ninth switch element provided between the fourth node and a supply node of the first analog reference voltage; and
    a tenth switch element provided between the output node of the second output voltage and the second reference node,
    the input voltage changes in a range between the first voltage and the second voltage, and
    the first voltage and the second voltage are supplied to the second operational amplifier as power supply voltages.

12. A source driver comprising:
    the amplification circuit according to claim 1; and
    a signal generation circuit including an inverter to which a first supply voltage and a second supply voltage are supplied as a low-potential power supply and a high-potential power supply, respectively, the first supply voltage changing in a range between the first voltage and the second voltage that is higher than the first voltage, the second supply voltage changing in a range between a fourth voltage that is higher than the first voltage and the third voltage that is higher than the fourth voltage, and the second voltage or the fourth voltage being input to a gate of the inverter, wherein the inverter outputs a signal at a voltage level of the first voltage in a period in which the first supply voltage is at the voltage level of the first voltage and the second supply voltage is at a voltage level of the fourth voltage, and outputs a signal at a voltage level of the third voltage in a period in which the first supply voltage is at a voltage level of the second voltage and the second supply voltage is at the voltage level of the third voltage.

13. A source driver comprising:

the amplification circuit according to claim 1; and a circuit device including:

a voltage generation circuit that generates and outputs a first supply voltage and a second supply voltage, the first supply voltage changing in a range between the first voltage and the second voltage that is higher than the first voltage, and the second supply voltage changing in a range between the second voltage and the third voltage that is higher than the second voltage; and a signal generation circuit including an inverter to which the first supply voltage and the second supply voltage are supplied as a low-potential power supply and a high-potential power supply, respectively, the second voltage being input to a gate of the inverter, wherein the voltage generation circuit is placed in a first state or a second state based on a state switching signal, outputs a voltage level of the first voltage as the first supply voltage and outputs a voltage level of the second voltage as the second supply voltage in the first state, and outputs the voltage level of the second voltage as the first supply voltage and outputs a voltage level of the third voltage as the second supply voltage in the second state, and the signal generation circuit outputs a signal at the voltage level of the first voltage when the voltage generation circuit is in the first state, and outputs a signal at the voltage level of the third voltage when the voltage generation circuit is in the second state.

14. An electrooptical device comprising the source driver according to claim 8.

15. An electrooptical device comprising the source driver according to claim 9.

16. An electrooptical device comprising the source driver according to claim 10.

17. An electrooptical device comprising the source driver according to claim 11.

18. An electrooptical device comprising the source driver according to claim 12.

19. An electrooptical device comprising the source driver according to claim 13.

20. An electronic device comprising the electrooptical device according to claim 14.

* * * * *